United States Patent
Chiang et al.

(10) Patent No.: US 11,742,352 B2
(45) Date of Patent: Aug. 29, 2023

(54) VERTICAL SEMICONDUCTOR DEVICE WITH STEEP SUBTHRESHOLD SLOPE

(71) Applicant: TAIWAN SEMICONDUCTOR MANUFACTURING CO., LTD., Hsinchu (TW)

(72) Inventors: Hung-Li Chiang, Taipei (TW); Szu-Wei Huang, Hsinchu (TW); Chih-Chieh Yeh, Taipei (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/826,154

(22) Filed: May 26, 2022

(65) Prior Publication Data

US 2022/0320092 A1    Oct. 6, 2022

Related U.S. Application Data

(63) Continuation of application No. 17/066,424, filed on Oct. 8, 2020, now Pat. No. 11,348,920, which is a
(Continued)

(51) Int. Cl.
| | |
|---|---|
| *H01L 27/092* | (2006.01) |
| *H01L 29/06* | (2006.01) |
| *H01L 29/78* | (2006.01) |
| *H01L 23/528* | (2006.01) |
| *H01L 21/8238* | (2006.01) |
| *H01L 21/8234* | (2006.01) |
| *H01L 29/66* | (2006.01) |

(52) U.S. Cl.
CPC .. *H01L 27/0922* (2013.01); *H01L 21/823493* (2013.01); *H01L 21/823807* (2013.01); *H01L 21/823828* (2013.01); *H01L 21/823871* (2013.01); *H01L 21/823885* (2013.01); *H01L 21/823892* (2013.01); *H01L 23/5283* (2013.01); *H01L 27/092* (2013.01); *H01L 27/0928* (2013.01); *H01L 29/0649* (2013.01); *H01L 29/66666* (2013.01); *H01L 29/7827* (2013.01)

(58) Field of Classification Search
CPC ..... H01L 21/823807; H01L 21/823828; H01L 21/823871; H01L 23/5283; H01L 27/0922; H01L 27/092; H01L 27/0928; H01L 29/0649; H01L 29/66666; H01L 29/7827
USPC ....................................................... 527/455
See application file for complete search history.

(56) References Cited

U.S. PATENT DOCUMENTS

| | | |
|---|---|---|
| 5,990,509 A | 11/1999 | Burns, Jr. et al. |
| 6,204,123 B1 | 3/2001 | Mori |
| (Continued) | | |

OTHER PUBLICATIONS

Jiro Ida, et al., "Super Steep Subthreshold Slop PN-Body Tied SOI FET with Ultra Low Drain Voltage down to 0.1V", EDM15-625-627, Feb. 18, 2016.

*Primary Examiner* — Igwe U Anya
(74) *Attorney, Agent, or Firm* — Maschoff Brennan

(57) ABSTRACT

A semiconductor device includes first and second source/drain structures, a channel layer, a gate structure, and an epitaxial layer. The channel layer is above the first source/drain structure. The second source/drain structure is above the channel layer. The gate structure is on a first side surface of the channel layer. The epitaxial layer forms a P-N junction with a second side surface of the channel layer.

20 Claims, 28 Drawing Sheets

Related U.S. Application Data continuation of application No. 16/391,152, filed on Apr. 22, 2019, now Pat. No. 10,804,268, which is a continuation of application No. 15/605,983, filed on May 26, 2017, now Pat. No. 10,269,800.

(56) References Cited

U.S. PATENT DOCUMENTS

| | | |
|---|---|---|
| 6,433,382 B1 | 8/2002 | Orlowski et al. |
| 6,990,509 B2 | 1/2006 | Hokenek et al. |
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,659,956 B1 | 5/2017 | Pachamuthu et al. |
| 9,985,026 B2 | 5/2018 | Chang et al. |
| 10,319,715 B2 * | 6/2019 | Heo ................. H01L 21/823487 |
| 2003/0052721 A1 * | 3/2003 | Chaudhry ......... H01L 21/82285 257/E21.612 |
| 2011/0108985 A1 | 5/2011 | Kim |
| 2013/0105872 A1 | 5/2013 | Kim et al. |
| 2016/0049397 A1 | 2/2016 | Chang et al. |
| 2016/0365456 A1 * | 12/2016 | Liu ..................... H01L 29/7883 |
| 2018/0342500 A1 | 11/2018 | Chetlur et al. |
| 2019/0157161 A1 | 5/2019 | Balakrishnan et al. |

* cited by examiner

VERTICAL SEMICONDUCTOR DEVICE WITH STEEP SUBTHRESHOLD SLOPE

PRIORITY CLAIM AND CROSS-REFERENCE

The present application is continuation application of U.S. application Ser. No. 17/066,424, filed Oct. 8, 2020, now U.S. Pat. No. 11,348,920, issued May 31, 2022, which is a continuation application of U.S. application Ser. No. 16/391,152, filed Apr. 22, 2019, now U.S. Pat. No. 10,804,268, issued Oct. 13, 2020, which is a continuation application of U.S. application Ser. No. 15/605,983, filed May 26, 2017, now U.S. Pat. No. 10,269,800, issued Apr. 23, 2019, all of which are herein incorporated by reference in their entireties.

BACKGROUND

As the semiconductor industry has progressed into nanometer technology nodes in pursuit of higher device density, higher performance, and lower costs, challenges from both fabrication and design issues have resulted in the development of three-dimensional designs, such as a vertical gate all around (VGAA) transistor. A typical VGAA transistor enables enhanced control of the charge carriers along the lengthwise direction through a complete encirclement of the channel region of a semiconductor nanowire by a gate dielectric and a gate electrode. The VGAA transistor has a reduced short channel effect (e.g. compared to a planar transistor), because the channel region may be surrounded by the gate electrode so that an effect of the source/drain region on an electric field of the channel region may be reduced (e.g. relative to a planar transistor). On the other hand, a subthreshold drain current of a field effect transistor (FET) is the current that flows between the source and drain of the FET when the transistor is in a subthreshold region (where the gate-to-source voltage is below the threshold voltage). A steep subthreshold slope of the FET may improve the on and off current ratio, and therefore reduces a leakage current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
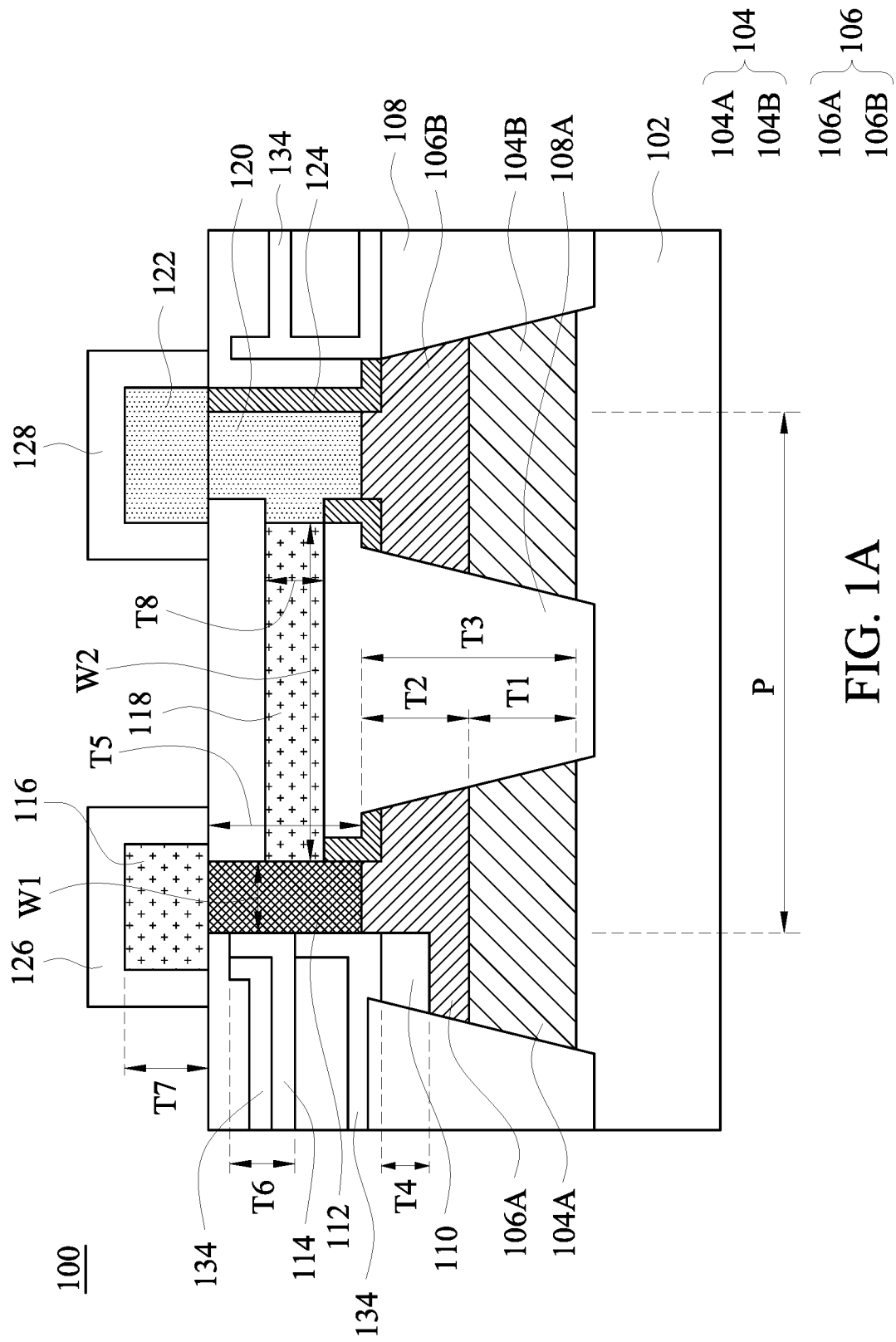
FIG. 1A and FIG. 1B are schematic cross-sectional views of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

It will be understood that, although the terms "first," "second," "third," "fourth," "fifth," "sixth," etc., may be used in the claims to describe various elements and/or features, these elements and/or features should not be limited by these terms, and these elements and/or features correspondingly described in the embodiments are presented by different reference numbers. These terms are used to distinguish one element and/or feature from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "upper," "lower," "above," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure are directed to a semiconductor device, in which a novel body structure is provided for a vertical field effect transistor (FET). Such body structure includes a P-N junction (or an N-P junction) where a body bias can be applied to improve a subthreshold slope steep of the vertical FET, so as to boost the device performance of the vertical FET with a certain back bias applied to the body structure.

Figure 1B:
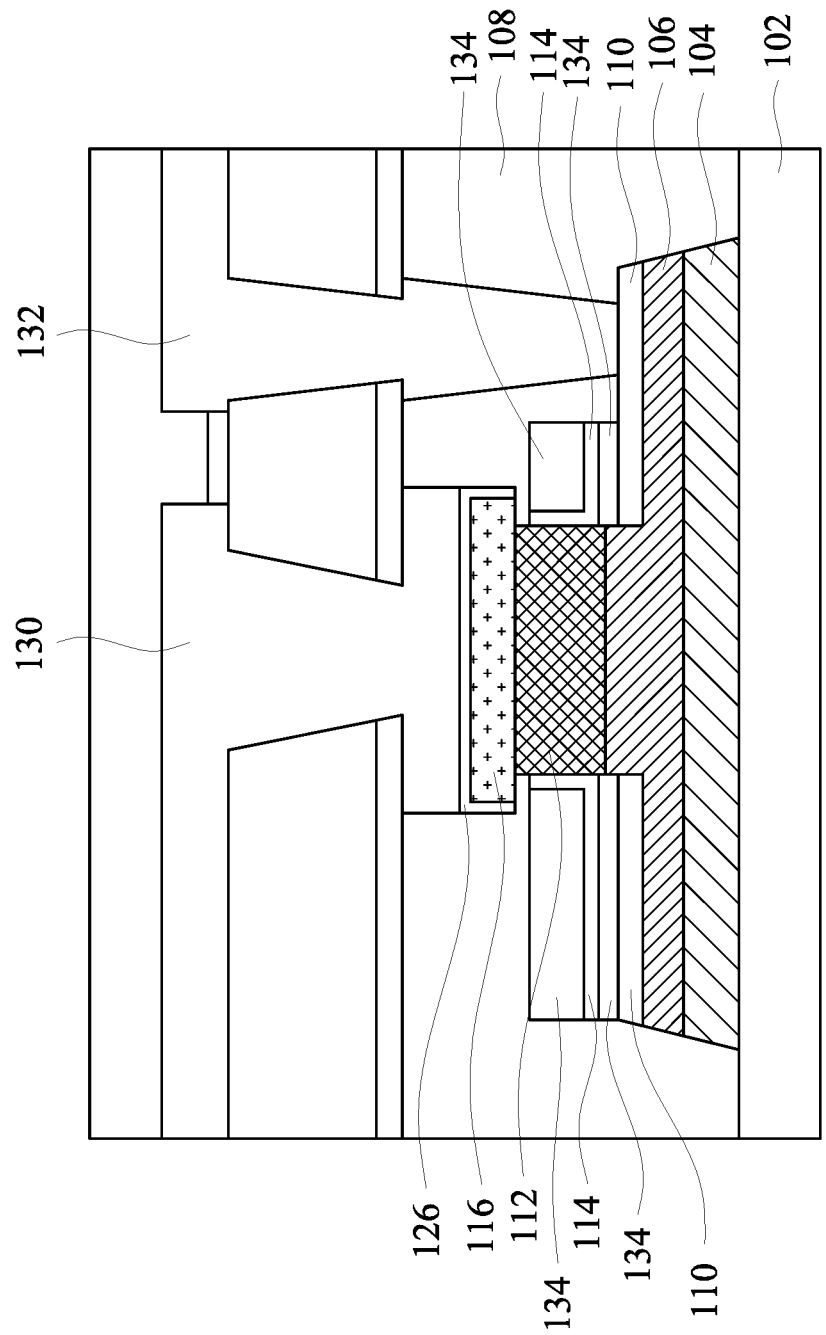

FIG. 1A and FIG. 1B are schematic cross-sectional diagrams of a semiconductor device 100 in accordance with some embodiments. The semiconductor device 100 may be a P-type or N-type device, such as a P-type/N-type FET. As shown in FIG. 1A and FIG. 1B, in the semiconductor device 100 a substrate 102 is provided, which may be a semiconductor substrate, such as a bulk semiconductor, a semiconductor-on-insulator (SOI) substrate, or the like. In a case of SOI substrate, a semiconductor material layer is formed on an insulator layer. The insulator layer may be, for example, a buried oxide (BOX) layer, a silicon oxide layer, or the like, and may be provided on a substrate such as a silicon substrate and a glass substrate. Another substrate, such as a multi-layered and a gradient substrate, may also be used. In some embodiments, the semiconductor material layer may include, for example, silicon, germanium, silicon carbide (SiC), silicon germanium (SiGe), gallium arsenide (GaAs), gallium phosphide (GaP), gallium arsenide phosphide (GaAsP), indium arsenide (InAs), indium phosphide (InP), indium antimonide (InSb), aluminum indium arsenide (AlInAs), aluminum gallium arsenide (AlGaAs), gallium arsenide (GaInAs), gallium indium phosphide (GaInP), gallium indium arsenide phosphide (GaInAsP), combinations thereof, or another suitable material.

A semiconductor layer 104 is on the substrate 102. The semiconductor layer 104 may include dopants of appropriate types and concentrations. In the embodiments where the semiconductor device 100 is a P-type FET, the semiconductor layer 104 may include N-type dopants, such as phosphorus, antimony, arsenic, and/or the like. Oppositely, in the embodiments where the semiconductor device 100 is an N-type FET, the semiconductor layer 104 may include P-type dopants, such as boron, gallium, indium, and/or the like. A dopant concentration of the semiconductor layer 104 may be about $10^{13}$ atoms/cm$^3$ to about $10^{16}$ atoms/cm$^3$. In some embodiments, a thickness T1 of the semiconductor layer 104 is about 30 nm.

A semiconductor layer 106 is on the semiconductor layer 104. In the embodiments where the semiconductor device 100 is a P-type FET, the semiconductor layer 106 may include P-type dopants, such as boron, boron fluoride, silicon, germanium, carbon, zinc, cadmium, beryllium, magnesium, indium, combinations thereof, and/or the like. Oppositely, in the embodiments where the semiconductor device 100 is an N-type FET, the semiconductor layer 106 may include N-type dopants, such as phosphorus, arsenic, antimony, silicon, germanium, carbon, oxygen, sulfur, selenium, tellurium, combinations thereof, and/or the like. A dopant concentration of the semiconductor layer 106 may be about $10^{18}$ atoms/cm$^3$ to about $10^{22}$ atoms/cm$^3$. In some embodiments, a thickness T2 of the semiconductor layer 106 is about 20 nm to about 30 nm.

A dielectric layer 108 is on the substrate 102 and surrounds the semiconductor layer 104 and the semiconductor layer 106. The dielectric layer 108 may include flowable oxide. For example, the dielectric layer 108 may include phosphosilicate glass (PSG), borosilicate glass (BSG), boron-doped phosphosilicate glass (BPSG), tetraethyl orthosilicate (TEOS) oxide, titanium nitride, silicon oxycarbide (SiOC), or another low-k nonporous dielectric material. As shown in FIG. 1A, a portion of the dielectric layer 108 is a shallow trench isolation (STI) 108A which separates portions of the semiconductor layer 104 and the semiconductor layer 106; a well 104A of the semiconductor layer 104 and a first source/drain structure 106A of the semiconductor layer 106 are at the left side of the STI 108A, and a body well 104B of the semiconductor layer 104 and the other portion of the semiconductor layer 106 (denoted as semiconductor layer 106B) are at the right side of the STI 108A. In some embodiments, a thickness T3 of the STI 108A is about 50 nm.

A silicide feature 110 is on the first source/drain structure 106A for electrically connection with another device. The silicide feature 110 may include a conductive film (not shown) on a portion of the first source/drain structure 106A. In some embodiments, the conductive film may include a conductive material, for example, titanium, nickel, platinum, cobalt, combinations thereof, or the like. The material of the conductive film may be diffused into the semiconductor layer 106 by using an annealing process. The silicide feature 110 may include a combination of the materials of the semiconductor layer 106 and the conductive film. In some embodiments, a thickness T4 of the silicide feature 110 is about 10 nm to about 20 nm.

A vertical channel layer 112 is above and in contact with the first source/drain structure 106A, and extends vertically from the first source/drain structure 106A. The vertical channel layer 112 may include a material, such as silicon, silicon phosphide (SiP), silicon phosphoric carbide (SiPC), silicon germanium, silicon germanium boron (SiGeB), germanium, germanium boron (GeB), germanium phosphoric (GeP), a III-V material such as indium phosphoric, gallium arsenide, aluminum arsenide (AlAs), indium arsenide, aluminum indium arsenide, gallium indium arsenide, indium antimonide, gallium antimonide (GaSb) and indium gallium antimonide (InGaSb), combinations thereof, and/or the like. In the embodiments where the semiconductor device 100 is a P-type FET, the vertical channel layer 112 may include N-type dopants, such as phosphorus, arsenic, silicon, germanium, carbon, oxygen, sulfur, selenium, tellurium, antimony, combinations thereof, and/or the like. Oppositely, in the embodiments where the semiconductor device 100 is an N-type FET, the vertical channel layer 112 may include P-type dopants, such as boron, boron fluoride ($BF_2$), silicon, germanium, carbon, zinc, cadmium, beryllium, magnesium, indium, combinations thereof, and/or the like. A dopant concentration of the vertical channel layer 112 may be about $10^{12}$ atoms/cm$^3$ to about $10^{18}$ atoms/cm$^3$, depending on various threshold voltage design requirements. In certain embodiments, the vertical channel layer 112 may be even undoped. In some embodiments, a thickness T5 and a width W1 of the vertical channel layer 112 are about 20-40 nm and about 5-10 nm, respectively.

A gate structure 114 surrounds a portion of sidewalls of the vertical channel layer 112. The gate structure 114 may include a gate dielectric layer and a gate electrode layer. The gate dielectric layer may be formed from a high-k material, such as nitride-based dielectric, silicon oxynitride, hafnium oxide, tantalum oxide, titanium oxide, zirconium oxide, aluminum oxide, yttrium oxide, lanthanum oxide, combinations thereof, and/or another suitable material. The gate electrode layer may be formed from polysilicon and a metallic material (such as titanium, tantalum, tungsten, aluminum, molybdenum, platinum and hafnium), a metal silicide material (such as titanium silicide, tantalum silicide, tungsten silicate, molybdenum silicate, nickel silicide and cobalt silicide), a metal nitride material (such as titanium nitride, tantalum nitride, tungsten nitride, molybdenum silicate, nickel nitride and cobalt nitride), silicide metal nitride (such as titanium silicon nitride, tantalum silicon nitride and tungsten silicon nitride), refractory metals, polysilicon, combinations thereof, and/or another suitable material. The gate structures 238A and 238B may be doped with metal dopants to have different work function values. In some embodiments, the gate electrode layer of the gate structure may include metal dopants of a particular concentration to have a desired work function value. The gate structure 114 may extend horizontally from the vertical channel layer 112. In some embodiments, a vertical length T6 of the gate structure 114 may be about 20 nm to about 30 nm.

A second source/drain structure 116 is above and in contact with the vertical channel layer 112. The second source/drain structure 116 is a semiconductor structure, which may be formed by epitaxially growing a semiconductor material, such as silicon, germanium, silicon germanium, silicon carbide, silicon phosphide, silicon phosphoric carbide, a III-V material such as indium phosphoric, gallium arsenide, aluminum arsenide, indium arsenide, aluminum indium arsenide, gallium indium arsenide, indium antimonide, gallium antimonide and indium gallium antimonide, combinations thereof, or the like. In the embodiments where the semiconductor device 100 is a P-type FET, the second source/drain structure 116 may include P-type dopants, such as boron, boron fluorine, silicon, germanium, carbon, zinc, cadmium, beryllium, magnesium, indium, combinations thereof, and/or the like. Oppositely, in the embodiments where the semiconductor device 100 is an N-type FET, the second source/drain structure 116 may include N-type dopants, such as phosphorus, arsenic, antimony, silicon, germanium, carbon, oxygen, sulfur, selenium, tellurium, combinations thereof, and/or the like. In some embodiments, a thickness T7 of the second source/drain structure 116 is about 20 nm to about 30 nm. In addition, the first source/drain structure 106A and the second source/drain structure 116 may have the same or different materials and/or the same or different dopants.

A body structure is in contact with the vertical channel layer 112 and opposite to the gate structure 114. In detail, the body structure includes a body epitaxial layer 118 and a body terminal 120. The body epitaxial layer 118 borders the other portion of the sidewalls of the vertical channel layer 112 that is not surrounded by the gate structure 114. In the embodiments where the semiconductor device 100 is a P-type FET, the body epitaxial layer 118 may include essential germanium or silicon germanium and may be implanted with P-type dopants, such as boron, boron fluorine, aluminum, gallium, indium, combinations thereof, and/or the like. Oppositely, in the embodiments where the semiconductor device 100 is an N-type FET, the body epitaxial layer 118 may include essential silicon and may be implanted with N-type dopants, such as phosphorus, arsenic, antimony, combinations thereof, and/or the like. A dopant concentration of the body epitaxial layer 118 may be about $10^{18}$ atoms/cm$^3$ to about $10^{22}$ atoms/cm$^3$, depending on various threshold voltage design requirements. In some embodiments, a thickness T8 and a width W2 of the body epitaxial layer 118 is about 20 nm and about 10-30 nm, respectively.

The body terminal 120 is in contact with the body epitaxial layer 118 and on the semiconductor layer 106B. As shown in FIG. 1A, the semiconductor layer 106B and the body well 104B form a bar structure for supporting the body terminal 120. The body terminal 120 may include, for example, silicon, silicon phosphide, silicon phosphoric carbide, silicon germanium, silicon germanium boron, germanium, germanium boron, germanium phosphoric, a III-V material such as indium phosphoric, gallium arsenide, aluminum arsenide, indium arsenide, aluminum indium arsenide, gallium indium arsenide, indium antimonide, gallium indium antimonide and indium gallium antimonide, combinations thereof, or the like. In the embodiments where the semiconductor device 100 is a P-type FET, the body terminal 120 may include N-type dopants, such as phosphorus, arsenic, silicon, germanium, carbon, oxygen, sulfur, selenium, tellurium, antimony, combinations thereof, and/or the like. Oppositely, in the embodiments where the semiconductor device 100 is an N-type FET, the body terminal 120 may include P-type dopants, such as boron, boron fluoride, silicon, germanium, carbon, zinc, cadmium, beryllium, magnesium, indium, combinations thereof, and/or the like. In some embodiments, a dopant concentration of the body terminal 120 may be about $10^{18}$ atoms/cm$^3$ to about $10^{22}$ atoms/cm$^3$, depending on various threshold voltage design requirements. In certain embodiments, a thickness and a width of the body terminal 120 are substantially the same as the thickness T5 and the width W1 of the vertical channel layer 112, respectively.

A semiconductor structure 122 is above and in contact with the body terminal 120. The semiconductor structure 122 may be formed by epitaxially growing a semiconductor material, such as silicon, germanium, silicon germanium, silicon carbide, silicon phosphide, silicon phosphoric carbide, a III-V material such as indium phosphoric, gallium arsenide, aluminum arsenide, indium arsenide, aluminum indium arsenide, gallium indium arsenide, indium antimonide, gallium antimonide and indium gallium antimonide, combinations thereof, or the like. In the embodiments where the semiconductor device 100 is a P-type FET, the semiconductor structure 122 may include P-type dopants, such as boron, boron fluorine, silicon, germanium, carbon, zinc, cadmium, beryllium, magnesium, indium, combinations thereof, and/or the like. Oppositely, in the embodiments where the semiconductor device 100 is an N-type FET, the semiconductor structure 122 may include N-type dopants, such as phosphorus, arsenic, antimony, silicon, germanium, carbon, oxygen, sulfur, selenium, tellurium, combinations thereof, and/or the like. In some embodiments, a thickness of the semiconductor structure 122 is substantially the same as the thickness T7 of the second source/drain structure 116. In addition, the first source/drain structure 106A and the second source/drain structure 116 may have the same or different materials and/or the same or different dopants.

In some embodiments, as shown in FIG. 1A, a liner layer 124 is partially conformal to the first source/drain structure 106A, the vertical channel layer 112, the semiconductor layer 106B and the body terminal 120. The liner layer 124 may include, for example, silicon nitride, silicon carbide, silicon carbon nitride, silicon oxycarbonitride, combinations thereof, or the like.

Silicide features 126 and 128 respectively surround the second source/drain structure 116 and the semiconductor structure 122 for electrically connection with another device. Each of the silicide features 126 and 128 may include a conductive material, for example, titanium, nickel, platinum, cobalt, combinations thereof, or the like. In some embodiments, a thickness of each of the silicide features 126 and 128 is about 10 nm to about 20 nm.

As shown in FIG. 1B, interconnect features 130 and 132 are above and in contact with the silicide features 110 and 126, respectively, for electrically coupling the first source/drain structure 106A and the second source/drain structure 116 with external devices. Each of the interconnect features 130 and 132 may include one or more layers of metal lines and/or vias. The interconnect features 130 and 132 may include a conductive material such as copper, aluminum, nickel, titanium, tungsten, combinations thereof, and/or another suitable conductive material.

The semiconductor device 100 may further include one or more hard mask layers 134 in its structure. The hard mask layers 134 may include one or more dielectric materials, such as silicon oxide (SiO), silicon nitride (SiN), silicon oxynitride (SiON), silicon carbon nitride (SiCN), silicon oxycarbonitride (SiOCN), titanium nitride, and/or the like.

From the structure shown in FIG. 1A, the body structure (including the body epitaxial layer 118 and the body terminal 120) and the vertical channel layer 112 constitute a bipolar device. In the embodiments where the semiconductor device 100 is a P-type FET, the body structure and the vertical channel layer 112 constitute an NPN bipolar junction transistor (BJT) structure; in the embodiments where the semiconductor device 100 is an N-type FET, the body structure and the vertical channel layer 112 constitute a PNP BJT structure. With such bipolar structure, the subthreshold steep of the semiconductor device 100 is advantageously improved, and therefore the semiconductor device 100 is suitable for a low power application.

FIG. 2 to FIG. 26 illustrate cross-sectional views of various intermediary steps of forming a semiconductor device in accordance with various embodiments.

Figure 2:
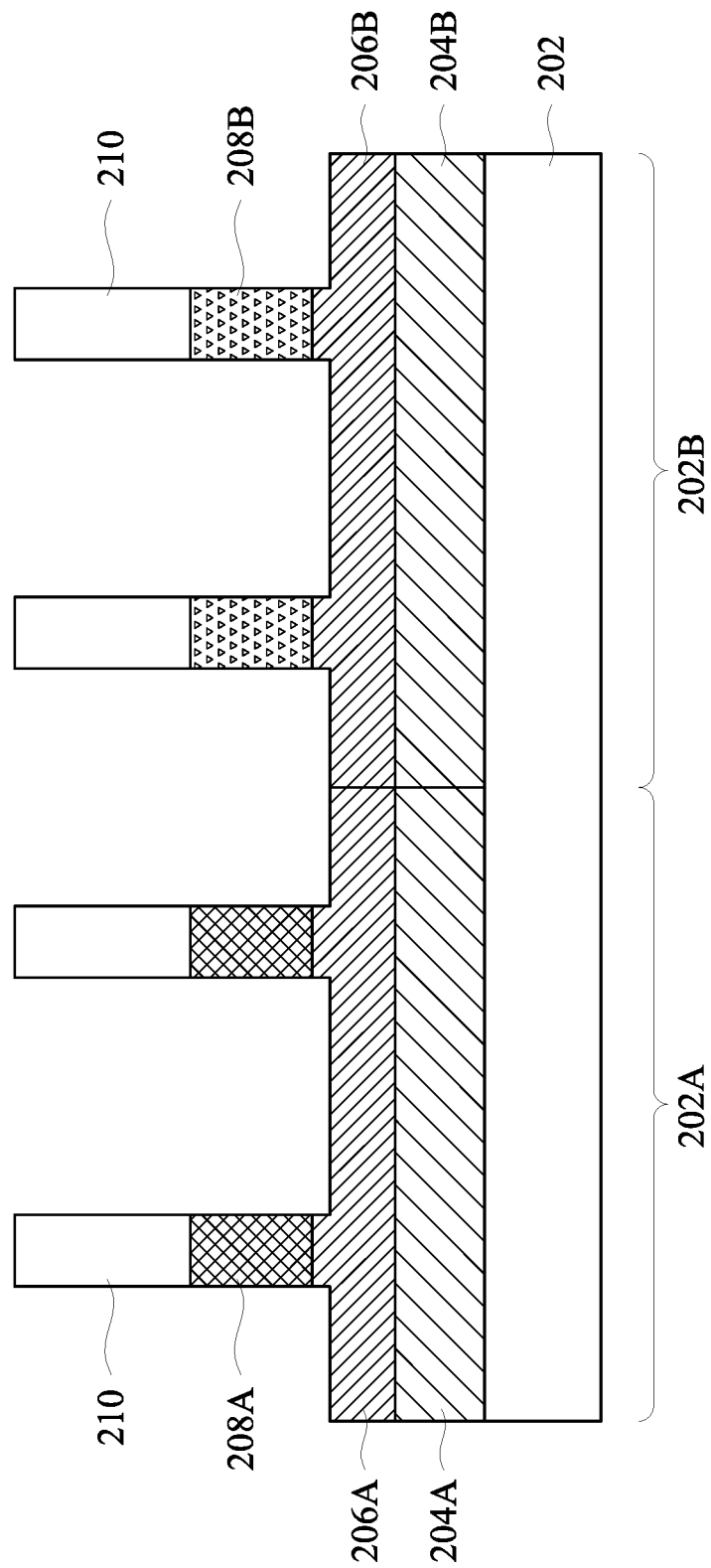
FIG. 2 to FIG. 26 are schematic cross-sectional views of intermediate stages in the formation of a semiconductor device in accordance with some embodiments of the present disclosure.

In FIG. 2, a substrate 202 is illustrated. The substrate 202 may be a semiconductor substrate, such as a bulk semiconductor, an SOI substrate, or the like. In a case of SOI substrate, a semiconductor material layer is formed on an insulator layer which may be, for example, a BOX layer, a silicon oxide layer, or the like. The insulator layer is provided on a substrate, typically a silicon substrate or a glass substrate. Another substrate, such as a multi-layered or gradient substrate may also be used. In some embodiments, the semiconductor material layer may be formed from, for example, silicon, germanium, silicon carbide, silicon germanium, gallium arsenide, gallium phosphide, gallium arsenide phosphide, indium arsenide, indium phosphide, indium antimonide, aluminum indium arsenide, aluminum gallium arsenide, gallium indium arsenide, gallium indium phosphide, gallium indium arsenide phosphide, combinations thereof, or another suitable material.

The substrate 202 includes a P-type device region 202A and an N-type device region 202B, and an N-type well 204A and a P-type well 204B on the substrate 202 are respectively in the P-type device region 202A and the N-type device region 202B. The N-type well 204A and the P-type well 204B may be formed, for example, by implanting dopants of appropriate types and concentrations into the substrate 202. For example, N-type dopants, such as phosphorus, antimony, arsenic, and/or the like, may be implanted into the substrate 202 with a concentration of about $10^{13}$ atoms/cm$^3$ to about $10^{16}$ atoms/cm$^3$ to form the N-type well 204A, and P-type dopants, such as boron, gallium, indium, and/or the like, may be implanted into the substrate 202 with a concentration of about $10^{13}$ atoms/cm$^3$ to about $10^{16}$ atoms/cm$^3$ to form the P-type well 204B.

Semiconductor layers 206A and 206B are formed on the N-type well 204A and the P-type well 204B, respectively. The semiconductor layer 206A may be formed from, for example, silicon, germanium, silicon germanium, germanium boron, silicon germanium boron, a III-V material (such as indium antimonide, gallium antimonide, indium gallium antimonide), combinations thereof, or the like. The semiconductor layer 206B may be formed from, for example, silicon, silicon phosphide, silicon phosphide carbide, germanium, germanium phosphide, a III-V material (such as indium phosphide, aluminum arsenide, gallium arsenide, indium arsenide, gallium indium arsenide and aluminum indium arsenide), combinations thereof, or the like. Each of the semiconductor layers 206A and 206B may be formed by using an epitaxy process, such as a metal-organic (MO) chemical vapor deposition (CVD) process, a liquid phase epitaxy (LPE) process, a vapor phase epitaxy (VPE) process, a molecular beam epitaxy (MBE) process, a selective epitaxial growth (SEG) process, combinations thereof, and/or another suitable process. Then, the semiconductor layers 206A and 206B are doped with dopants of appropriate types and concentrations. For example, P-type dopants, such as boron, boron fluorine, silicon, germanium, carbon, zinc, cadmium, beryllium, magnesium, indium, combinations thereof, and/or the like, may be implanted into the semiconductor layer 206A with a concentration of about $10^{18}$ atoms/cm$^3$ to about $10^{22}$ atoms/cm$^3$, and N-type dopants, such as phosphorus, arsenic, antimony, silicon, germanium, carbon, oxygen, sulfur, selenium, tellurium, combinations thereof, and/or the like, may be implanted into the semiconductor layer 206B with a concentration of about $10^{18}$ atoms/cm$^3$ to about $10^{22}$ atoms/cm$^3$.

Channel layers 208A and 208B are formed on the semiconductor layers 206A and 206B, respectively. Each of the channel layers 208A and 208B may be formed from, for example, silicon, silicon phosphoric, silicon phosphoric carbide, silicon germanium, silicon germanium boron, germanium, germanium boron, germanium phosphoric, a III-V material such as indium phosphoric, gallium arsenide, aluminum arsenide, indium arsenide, aluminum indium arsenide, gallium indium arsenide, indium antimonide, gallium antimonide and indium gallium antimonide, combinations thereof, or the like. Each of the channel layers 208A and 208B may be formed by using an epitaxy process, such as an MO CVD (MOCVD) process, an LPE process, a VPE process, an MBE process, an SEG process, combinations thereof, and/or another suitable process.

The channel layers 208A and 208B may be formed including different materials, different dopants, and/or different doping concentrations, depending on various device design requirements. For example, the channel layer 208A may be lightly doped with N-type dopants, such as phosphorus, arsenic, silicon, germanium, carbon, oxygen, sulfur, selenium, tellurium, antimony, combinations thereof, and/or the like, while the channel layer 208B may be lightly doped with P-type dopants, such as boron, boron fluoride, silicon, germanium, carbon, zinc, cadmium, beryllium, magnesium, indium, combinations thereof, and/or the like. In some embodiments, a dopant concentration of the each of the channel layers 208A or 208B may be about $10^{12}$ atoms/cm$^3$ to about $10^{18}$ atoms/cm$^3$, depending on various threshold voltage design requirements. In certain embodiments, each of the channel layers 208A or 208B may be even undoped.

A hard mask layer 210 is formed over the channel layers 208A and 208B. The hard mask layer 210 may be formed from one or more dielectric materials, such as silicon oxide, silicon nitride, silicon oxynitride, silicon carbon nitride, silicon oxycarbonitride, titanium nitride, and/or the like. The hard mask layer 210 may be formed by using one or more processes, such as a CVD process, a low pressure CVD (LPCVD) process, a plasma enhanced CVD (PECVD) process, a physical vapor deposition (PVD) process, an atomic layer deposition (ALD) process, a spin-on coating process, a sputtering process, a thermal oxidation process, combinations thereof, and/or the like.

Figure 3:
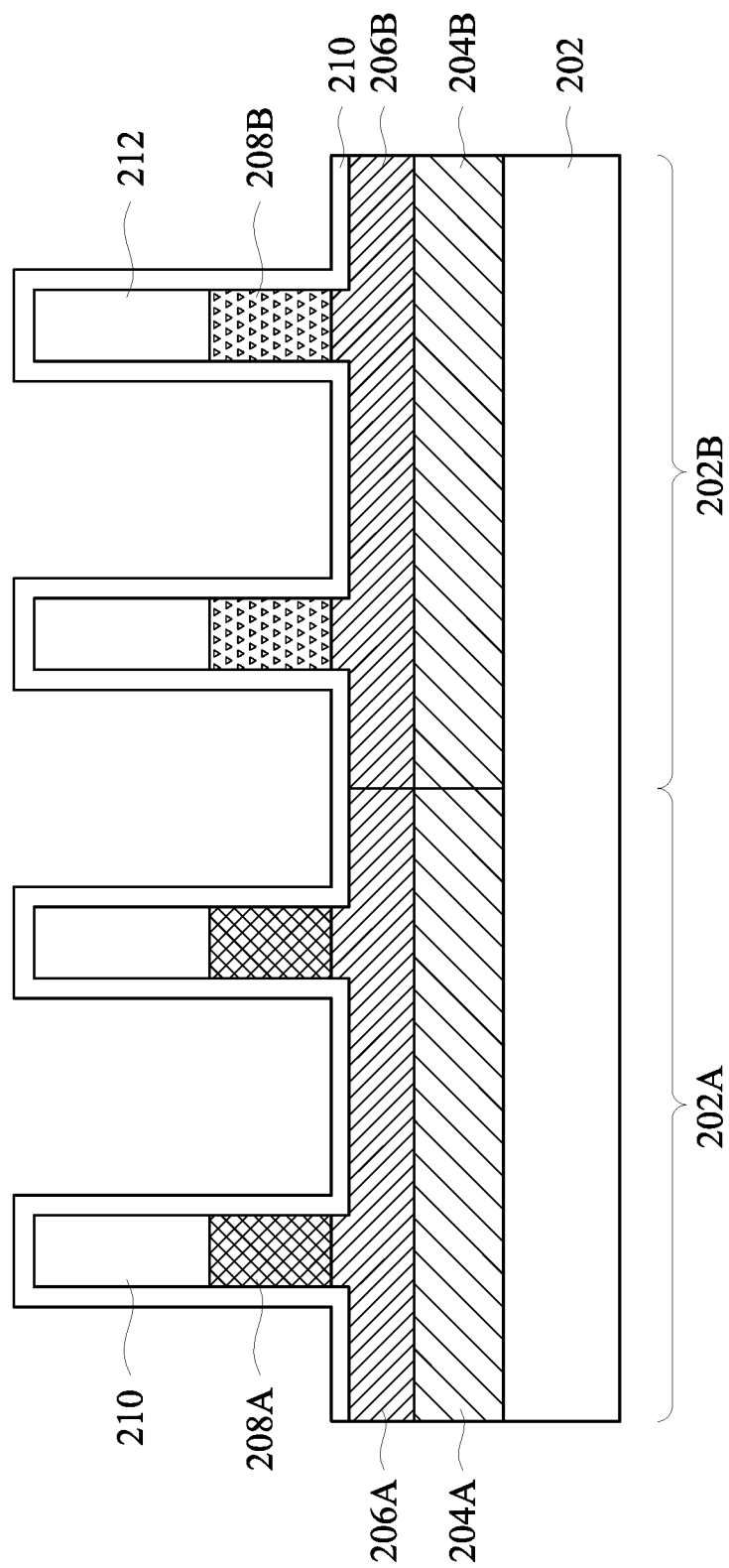

After the formation of the hard mask layer 210, an etching operation is performed to remove a portion of the hard mask layer 210, a portion of the channel layer 208A, a portion of the channel layer 208B, a portion of the semiconductor layer 206A and a portion of the semiconductor layer 206B. The etching operation to the hard mask layer 210, the channel layers 208A and 208B and the semiconductor layers 206A and 206B may include reactive ion etching process, a plasma etching process, a dry etching process, a wet etching process, combinations thereof, or another suitable etching process. As shown in FIG. 3, after the etching operation, the remained hard mask layer 210, the remained vertical channel layers 208A and 208B and a portion of the remained semiconductor layers 206A and 206B form vertical bar structures.

Referring next to FIG. 3, a liner layer 212 is formed over the hard mask layer 210, the vertical channel layers 208A and 208B and the semiconductor layers 206A and 206B. The liner layer 212 may be formed from, for example, silicon nitride, silicon carbide, silicon carbon nitride, silicon oxycarbonitride, combinations thereof, or the like, and may be formed by a deposition process (such as a CVD process, a PVD process and an ALD process) and a thermal oxidation process. Then, a portion of the liner layer 212 above the hard mask layer 210 is removed by performing, for example, a dry etching process such as a plasma etching process, or another suitable etching process.

Figure 4:
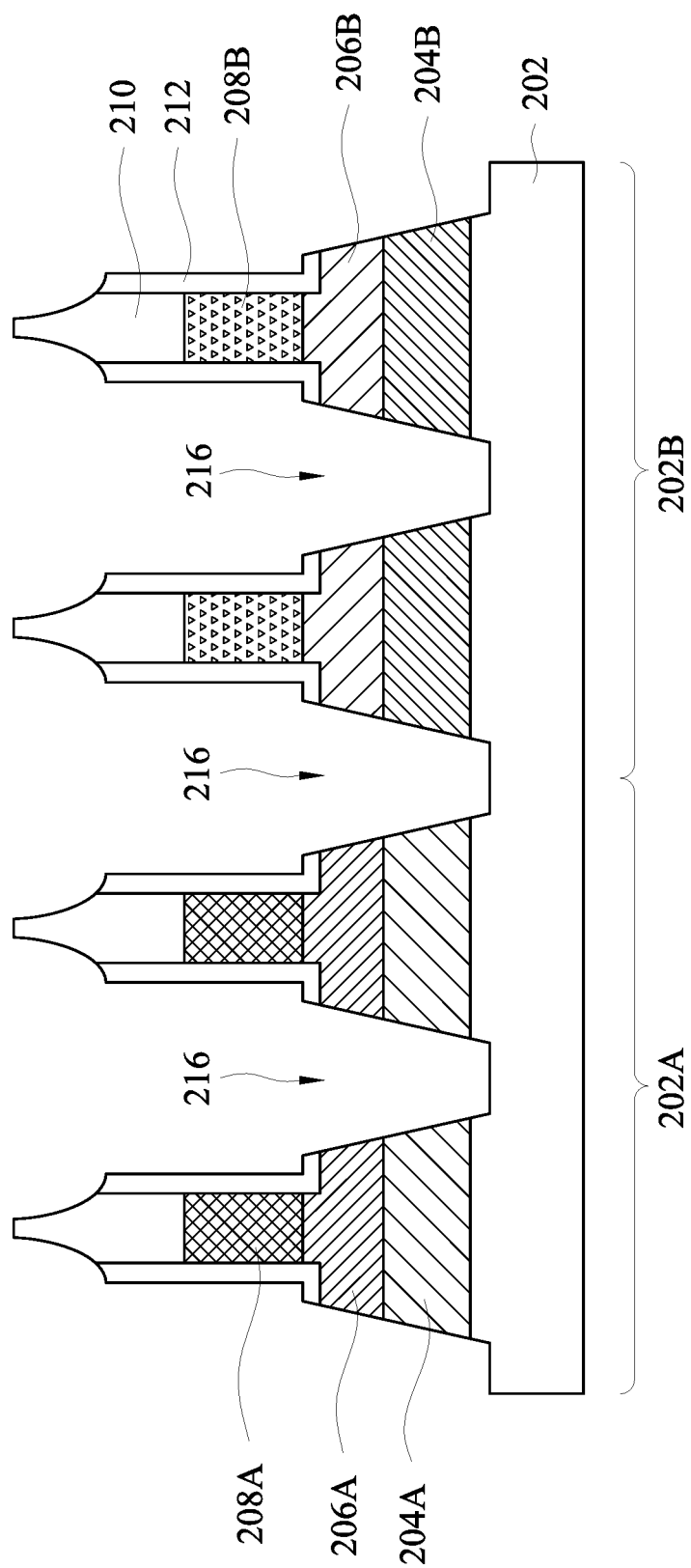

In FIG. 4, a patterned photoresist (not shown) is formed over the hard mask layer 210 and the liner layer 212 to define trench portions. The patterned photoresist (not shown) is formed including a photoresist material that is sensitive to light, X-ray, an electron beam, an ion beam, or other suitable radiation source, depending on the type of patterning operation for the patterned photoresist (not shown). In some embodiments, the patterned photoresist (not shown) is formed by using a spin-on coating process and a maskless lithography process, such as e-beam direct writing and another suitable process. Then, the portions of the liner layer 212, the semiconductor layers 206A and 206B, the N-type well 204A, the P-type well 204B and the substrate 202 uncovered by the patterned photoresist (not shown) are removed or etched by performing an etching operation to form trenches 216 which expose the substrate 202. The etching operation may include reactive ion etching process, a plasma etching process, a dry etching process, a wet etching process, combinations thereof, or another suitable etching process. The trenches 216 may be in the P-type device region 202A, in the N-type device region 202B and at the boundary between the P-type device region 202A and the N-type device region 202B, respectively. After the etching operation, the patterned photoresist (not shown) is removed by, for example, a wet stripping process and/or plasma ashing process, such as an oxygen plasma ashing process and another suitable process, and then a further etching process may be optionally performed to thinner the hard mask layer 210.

Figure 5:
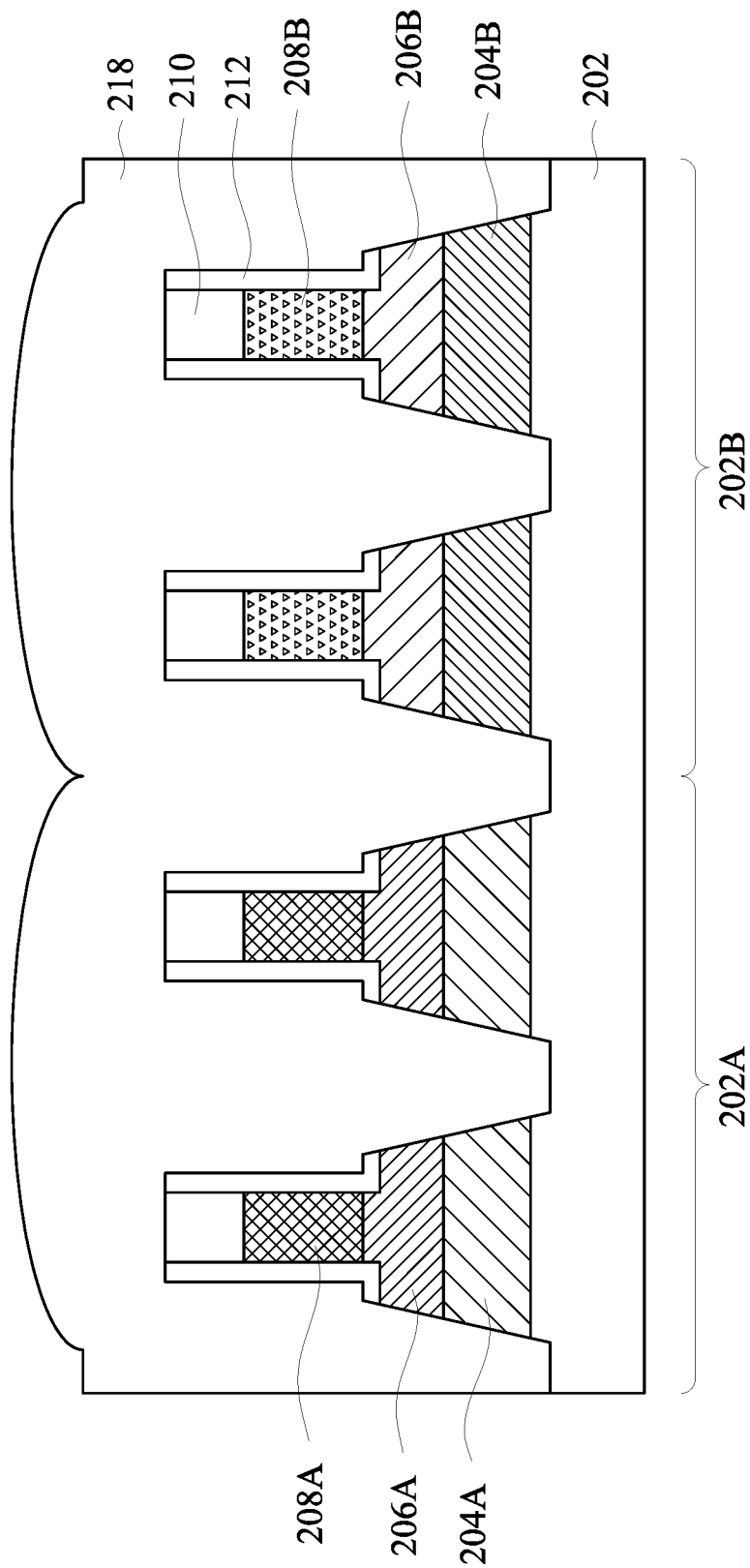

In FIG. 5, a dielectric layer 218 is formed over the substrate 202, the N-type well 204A, the P-type well 204B, the semiconductor layers 206A and 206B, the hard mask layer 210 and the liner layer 212 to fill the trenches 216. The dielectric layer 218 may be formed from a flowable oxide by using a flowable CVD process or another suitable process.

Figure 6:
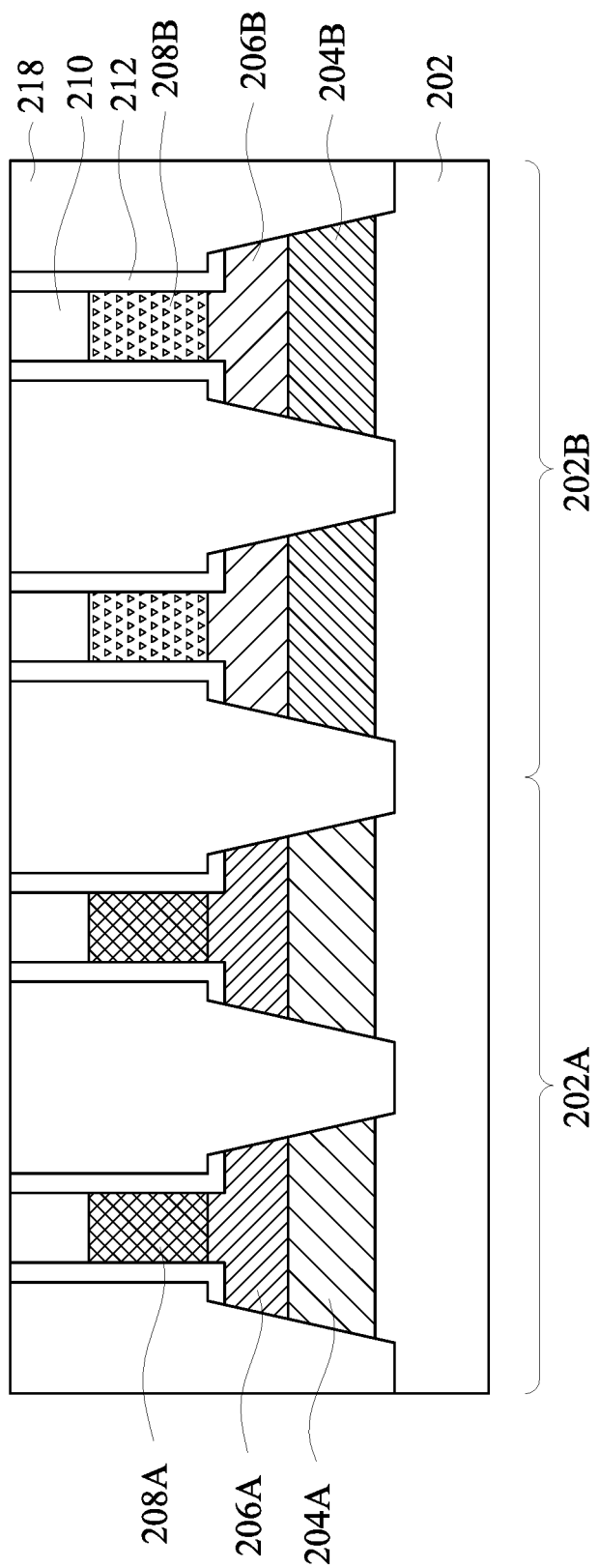

In FIG. 6, a portion of the dielectric layer 218 above the hard mask layer 210 and the liner layer 212 is removed by using, for example, a chemical mechanical polishing (CMP) process or another suitable planarization process, in order to planarize the dielectric layer 218 for subsequent operations.

Figure 7:
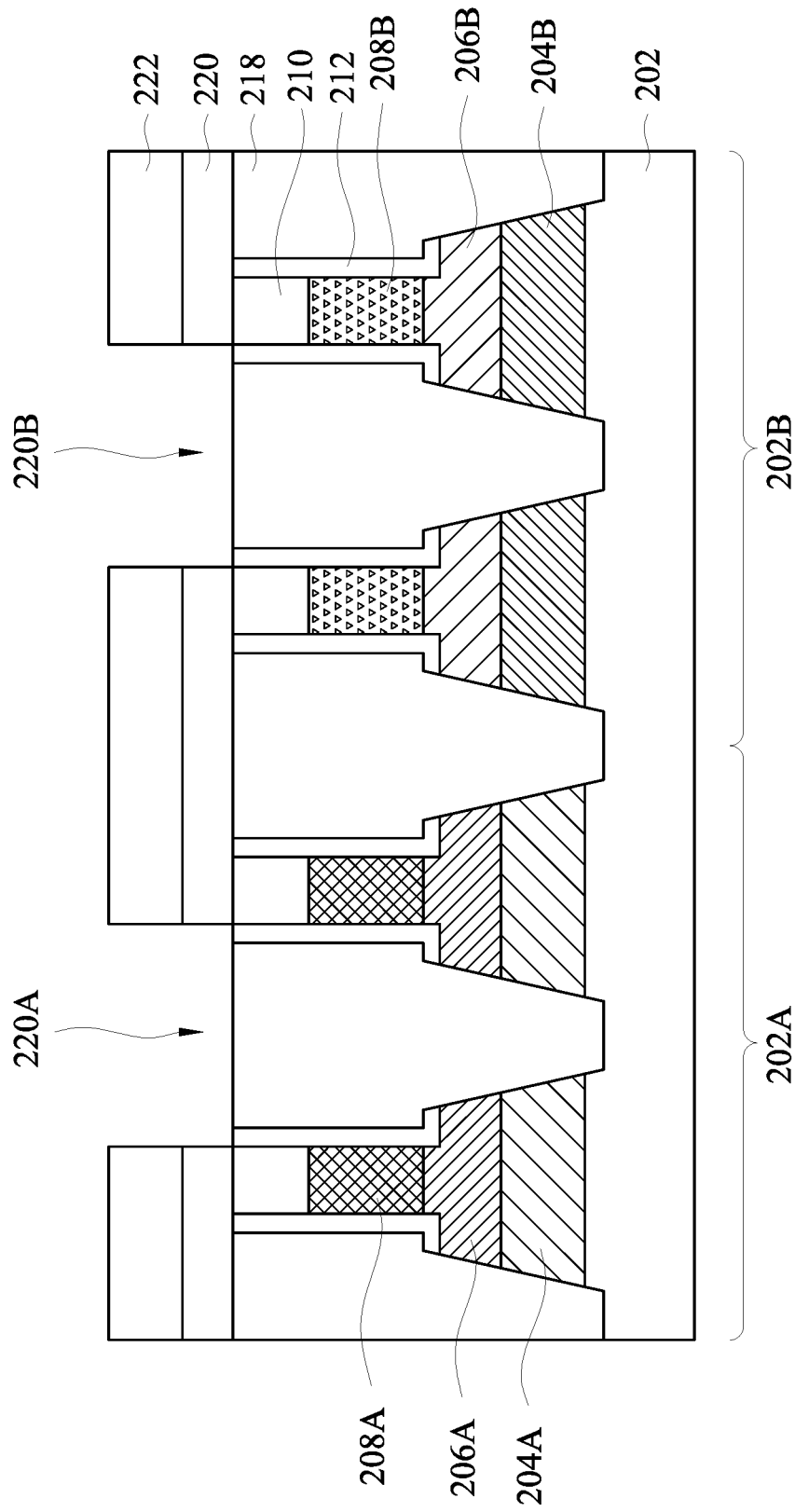

In FIG. 7, a hard mask layer 220 is formed over the hard mask layer 210, the liner layer 212 and the dielectric layer 218, and then a patterned photoresist 222 is formed on the hard mask layer 220 to define etching regions of the hard mask layer 220. As shown in FIG. 7, each of the etching portions of the hard mask layer 220 is vertically between two neighboring vertical bar structures. The hard mask layer 220 may be formed from one or more dielectric materials, such as silicon oxide, silicon nitride, silicon oxynitride, silicon carbon nitride, silicon oxycarbonitride, titanium nitride, and/or the like. The hard mask layer 220 may be formed by using one or more processes, such as a CVD process, an LPCVD process, a PECVD process, a PVD process, an ALD process, a spin-on coating process, a sputtering process, a thermal oxidation process, combinations thereof, and/or the like. The patterned photoresist 222 is formed including a photoresist material that is sensitive to light, X-ray, an electron beam, an ion beam, or other suitable radiation source, depending on the type of patterning operation for the patterned photoresist 222. In some embodiments, the patterned photoresist 222 is formed by using a spin-on coating process and a maskless lithography process, such as an e-beam direct writing process and another suitable process. Then, the etching portions of the hard mask layer 220 uncovered by the patterned photoresist 222 are removed to form openings 220A and 220B respectively in the P-type device region 202A and the N-type device region 202B. The etching operation may include reactive ion etching process, a plasma etching process, a dry etching process, a wet etching process, combinations thereof, or another suitable etching process.

Figure 8:
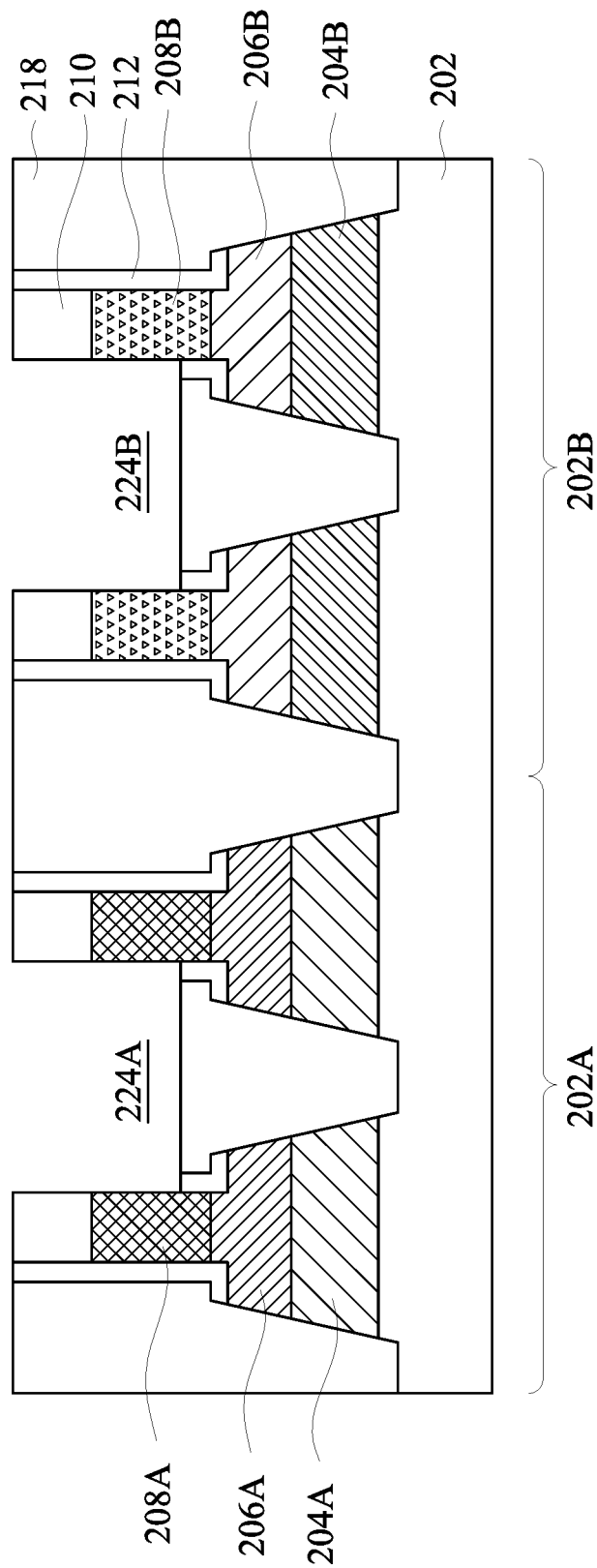

In FIG. 8, portions of the dielectric layer 218 uncovered by the hard mask layer 220 (i.e. below the openings 220A and 220B) are etched to formed spaces 224A and 224B respectively in the P-type device region 202A and the N-type device region 202B by using an etching process, such as a wet etching, a dry etching process and another suitable process. After the etching process, a top surface of a portion of the dielectric layer 218 vertically below the space 224A is in a vertical level between a top surface and a bottom surface of the vertical channel layer 208A, and a top surface of another portion of the dielectric layer 218 vertically below the space 224B is in a vertical level between a top surface and a bottom surface of the vertical channel layer 208B. The portions of the dielectric layer 218 uncovered by the hard mask layer 220 may be etched to have the same target height or various target heights depending on various desire requirements. In other words, the spaces 224A and 224B may have the same depth or various depths depending on various desire requirements. After the etching process, the hard mask layer 220 is then removed by using, for example, a wet etching process, a dry etching process, a plasma ashing processes, a CMP process, or another suitable processes.

Figure 9:
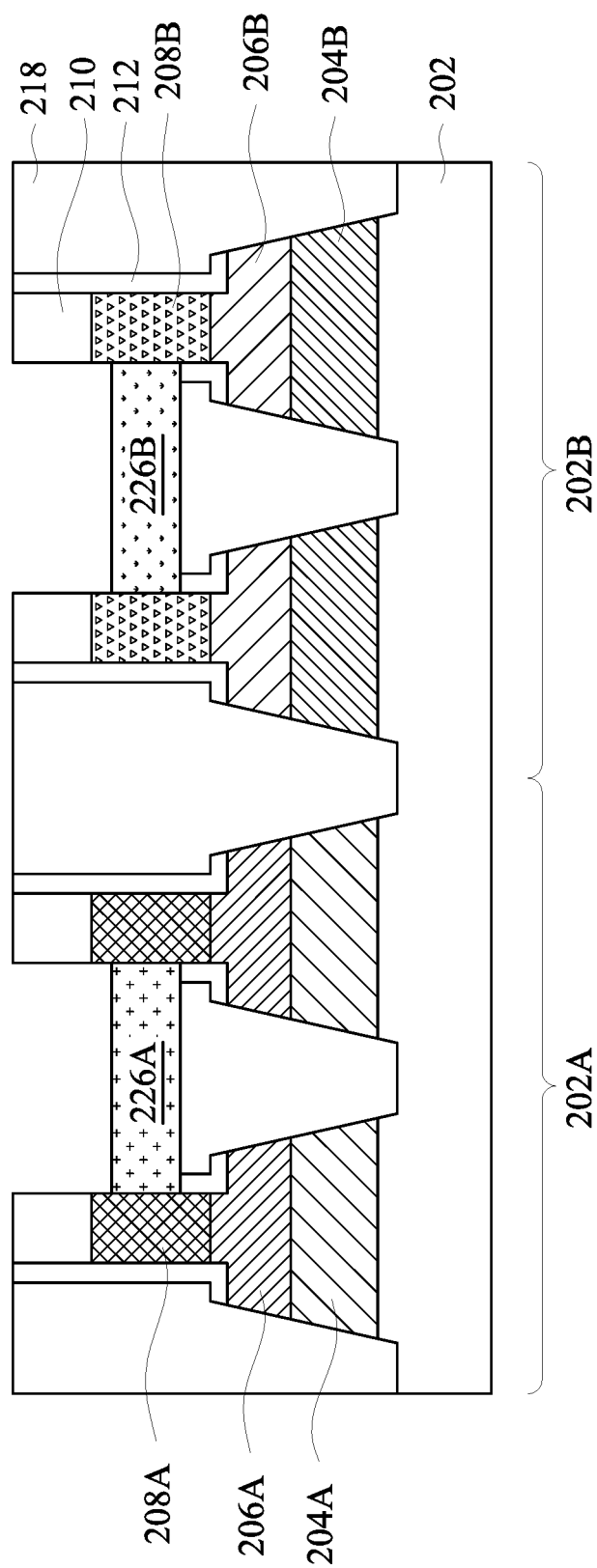

In FIG. 9, body epitaxial layers 226A and 226B are formed in the spaces 224A and 224B, respectively. Each of the body epitaxial layers 226A and 226B may be formed by an in-situ epitaxial growth process or another suitable epitaxial growth process. The body epitaxial layer 226A may be formed from essential germanium or silicon germanium, and may be implanted with P-type dopants, such as boron, boron fluorine, aluminum, gallium, indium, combinations thereof, and/or the like. The body epitaxial layer 226B may be formed from essential silicon, and may be implanted with N-type dopants, such as phosphorus, arsenic, antimony, combinations thereof, and/or the like.

Figure 10:
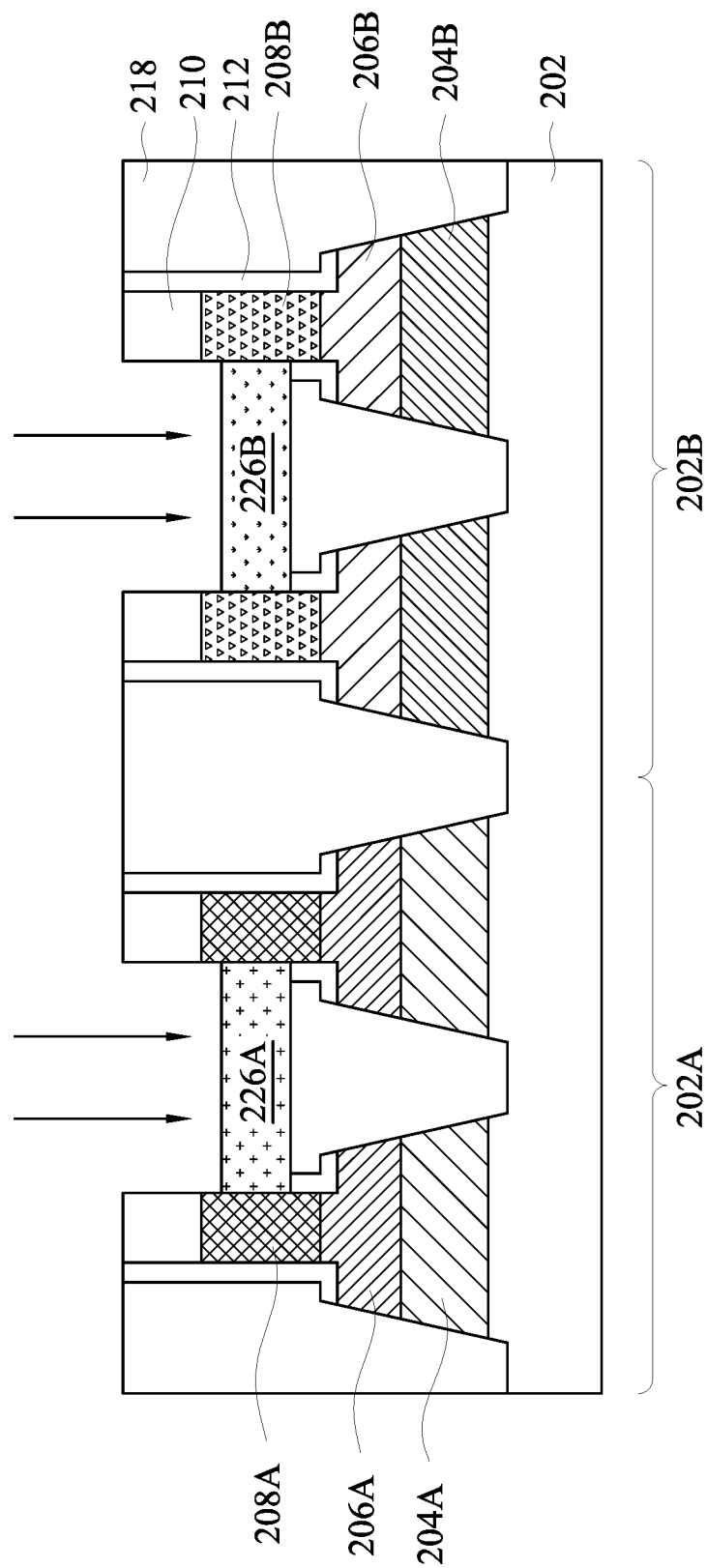

In FIG. 10, an etching back operation is performed on the body epitaxial layers 226A and 226B to reduce the thicknesses of the body epitaxial layers 226A and 226B respectively to desired thicknesses. In some embodiments, the body epitaxial layers 226A and 226B are respectively etched back by using one or more epitaxial growth processes and one or more etching back processes, such as a dry etching process, a wet etching process, combinations thereof, and/or the like.

Figure 11:
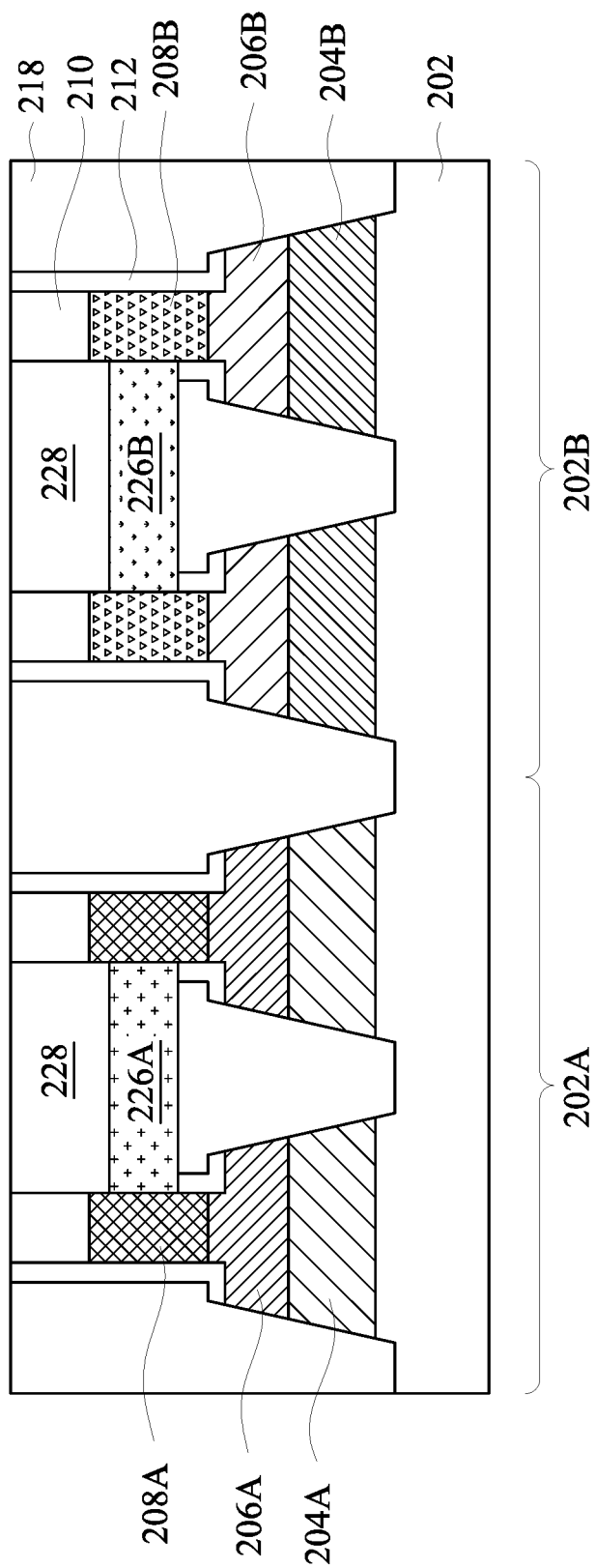

In FIG. 11, a dielectric layer 228 is formed over the body epitaxial layers 226A and 226B to fill the spaces 224A and 224B. The dielectric layer 228 may be formed from a flowable oxide by using a flowable CVD process or another suitable process.

Figure 12:
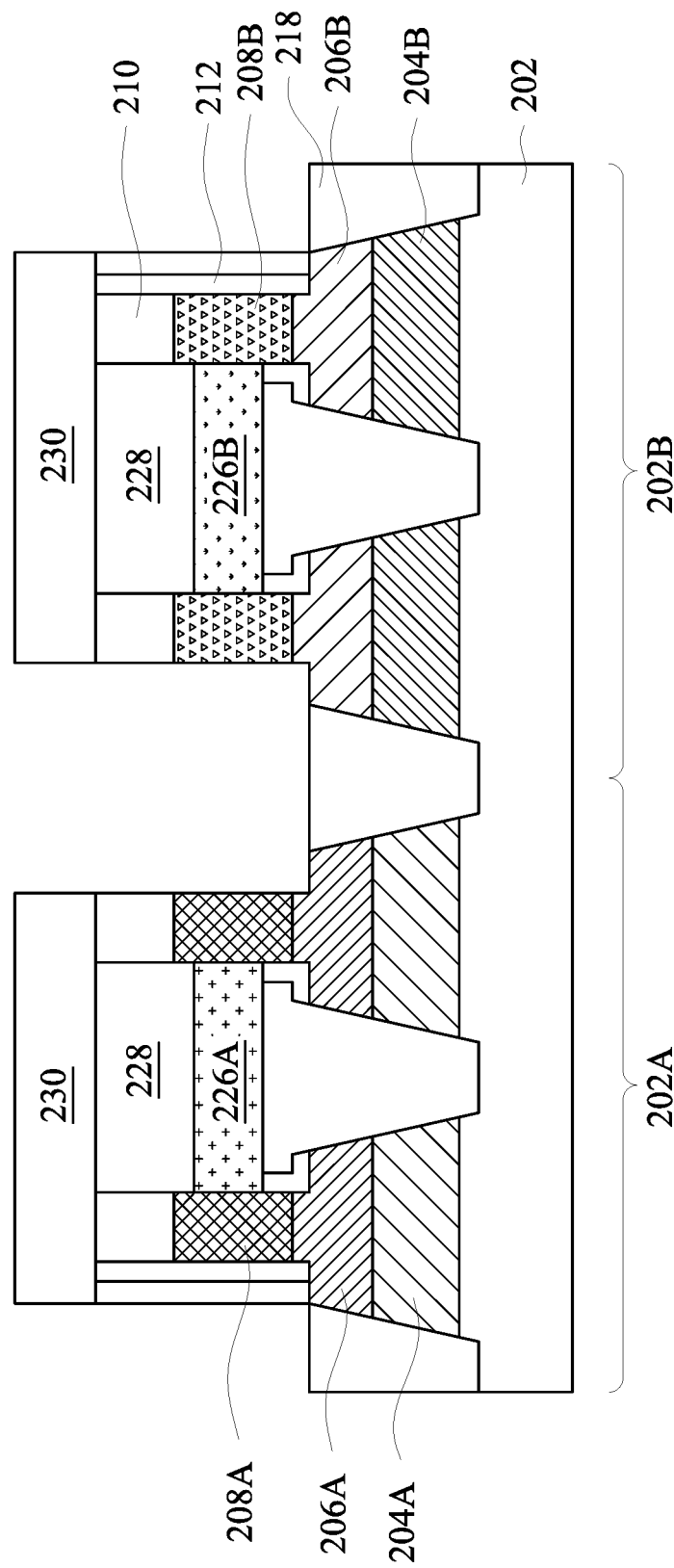

In FIG. 12, a patterned hard mask layer 230 is formed over the hard mask layer 210, the liner layer 212 and the dielectric layers 218 and 228. As shown in FIG. 12, in the P-type device region 202A, the vertical channel layer 208A, the hard mask layer 210, the liner layer 212, a portion of the dielectric layer 218, the body epitaxial layer 226A and the dielectric layer 228 are covered by the patterned hard mask layer 230, while the semiconductor layer 206A is partially exposed; in the N-type device region 202B, the vertical channel layer 208B, the hard mask layer 210, the liner layer 212, another portion of the dielectric layer 218, the body epitaxial layer 226B and the dielectric layer 228 are covered by the patterned hard mask layer 230, while the semiconductor layer 206B is partially exposed. The patterned hard mask layer 230 may be formed from one or more dielectric materials, such as silicon oxide, silicon nitride, silicon oxynitride, silicon carbon nitride, silicon oxycarbonitride, titanium nitride, and/or the like. The patterned hard mask layer 230 may be formed by using a deposition (such as a CVD process, an LPCVD process, a PECVD process, a PVD process, an ALD process, a spin-on coating process, a sputtering process, a thermal oxidation process, combinations thereof, and/or the like) and an etching process (such as a reactive ion etching process, a plasma etching process, a dry etching process, a wet etching process, combinations thereof, and/or the like).

Figure 13:
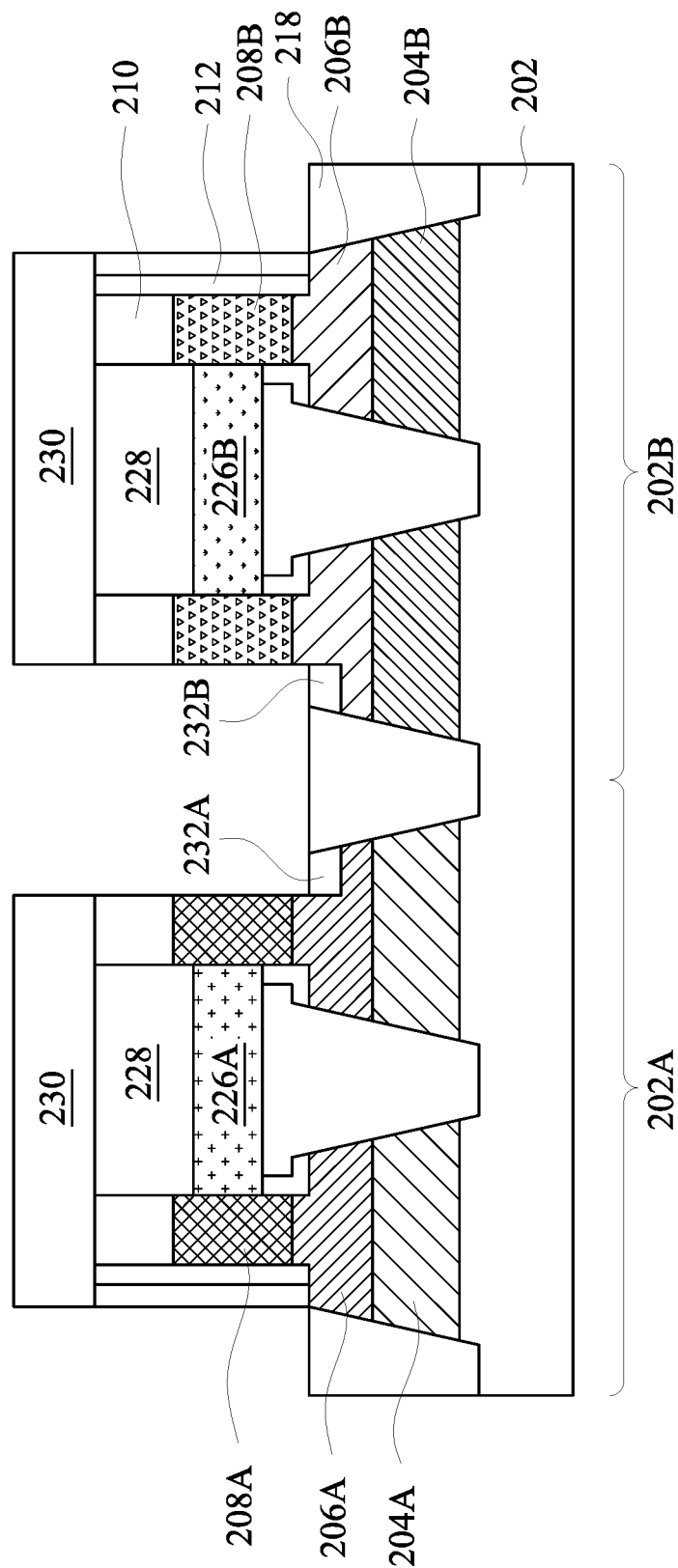

In FIG. 13, silicide features 232A and 232B are respectively formed on a portion of the semiconductor layer 206A and a portion of the semiconductor layer 206B uncovered by the dielectric layer 218. The silicide features 232A and 232B may be formed by first depositing a conductive film (not shown) on the exposed portions of the semiconductor layers 206A and 206B. In some embodiments, the conductive film may be formed from, for example, titanium, nickel, platinum, cobalt, combinations thereof, or the like. After depositing the conductive film, an annealing process may be performed to cause the diffusion of the material of the conductive film into the semiconductor layers 206A and 206B. The annealing process may be performed by using argon or nitrogen as a process gas under an environment in which the temperature is about 100° C. to about 900° C. and the atmospheric pressure is about 770 Torrs to about 850 Torrs. The silicide feature 232A may include a combination of the materials of the semiconductor layer 206A and the conductive film, and the silicide feature 232B may include a combination of the materials of the semiconductor layer 206B and the conductive film.

Figure 14:
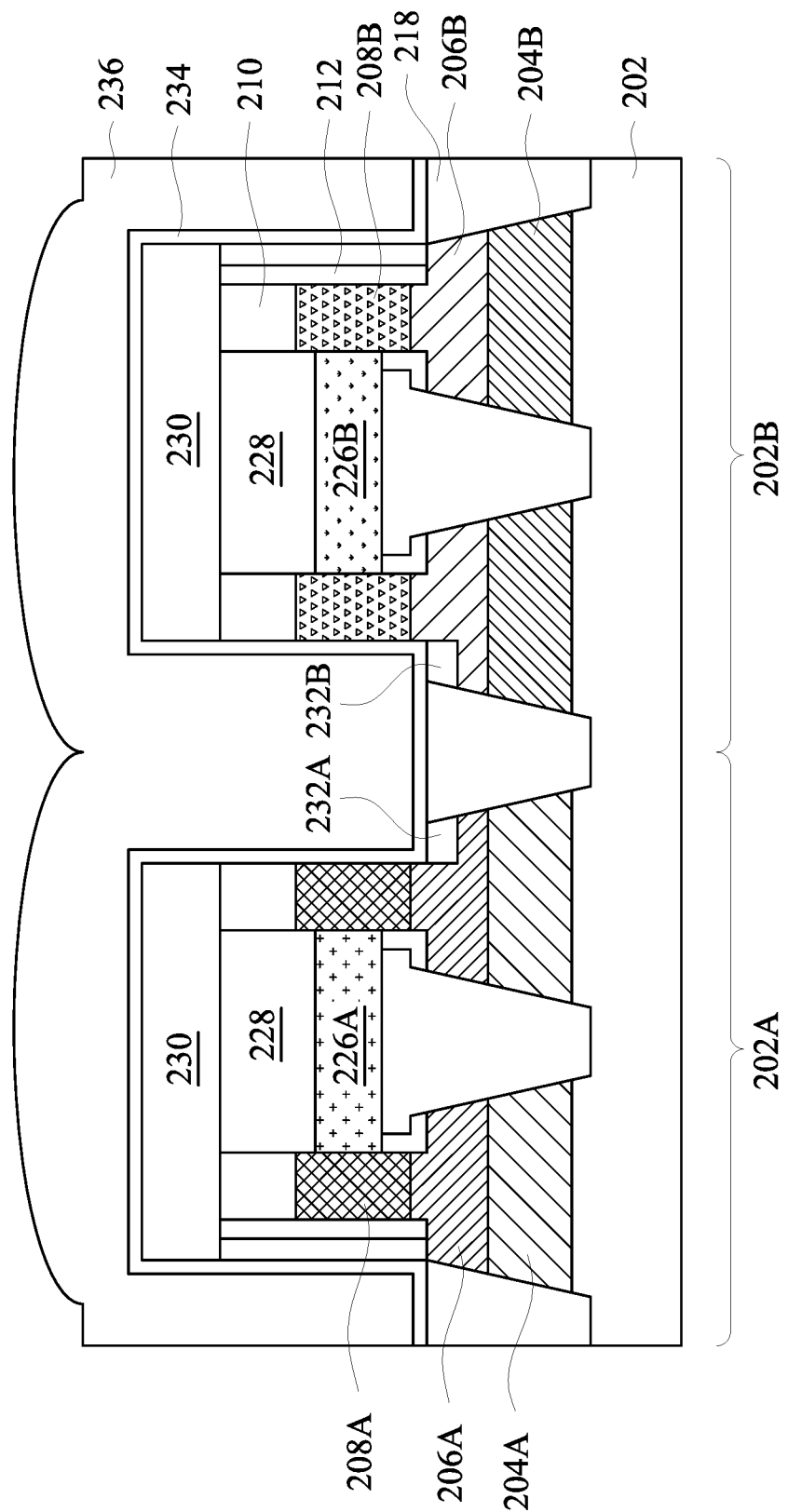

In FIG. 14, a hard mask layer 234 is formed over the hard mask layer 210, the liner layer 212, the dielectric layers 218 and 228, the hard mask layer 230 and the silicide features 232A and 232B, and a dielectric layer 236 is formed over the hard mask layer 234. The hard mask layer 234 may be formed from one or more dielectric materials, such as silicon oxide, silicon nitride, silicon oxynitride, silicon carbon nitride, silicon oxycarbonitride, titanium nitride, and/or the like, and may be formed by using one or more processes, such as a CVD process, an LPCVD process, a PECVD process, a PVD process, an ALD process, a spin-on coating process, a sputtering process, a thermal oxidation process, combinations thereof, and/or the like. The dielectric layer 236 may be formed from a flowable oxide by using a flowable CVD process or another suitable process.

Figure 15:
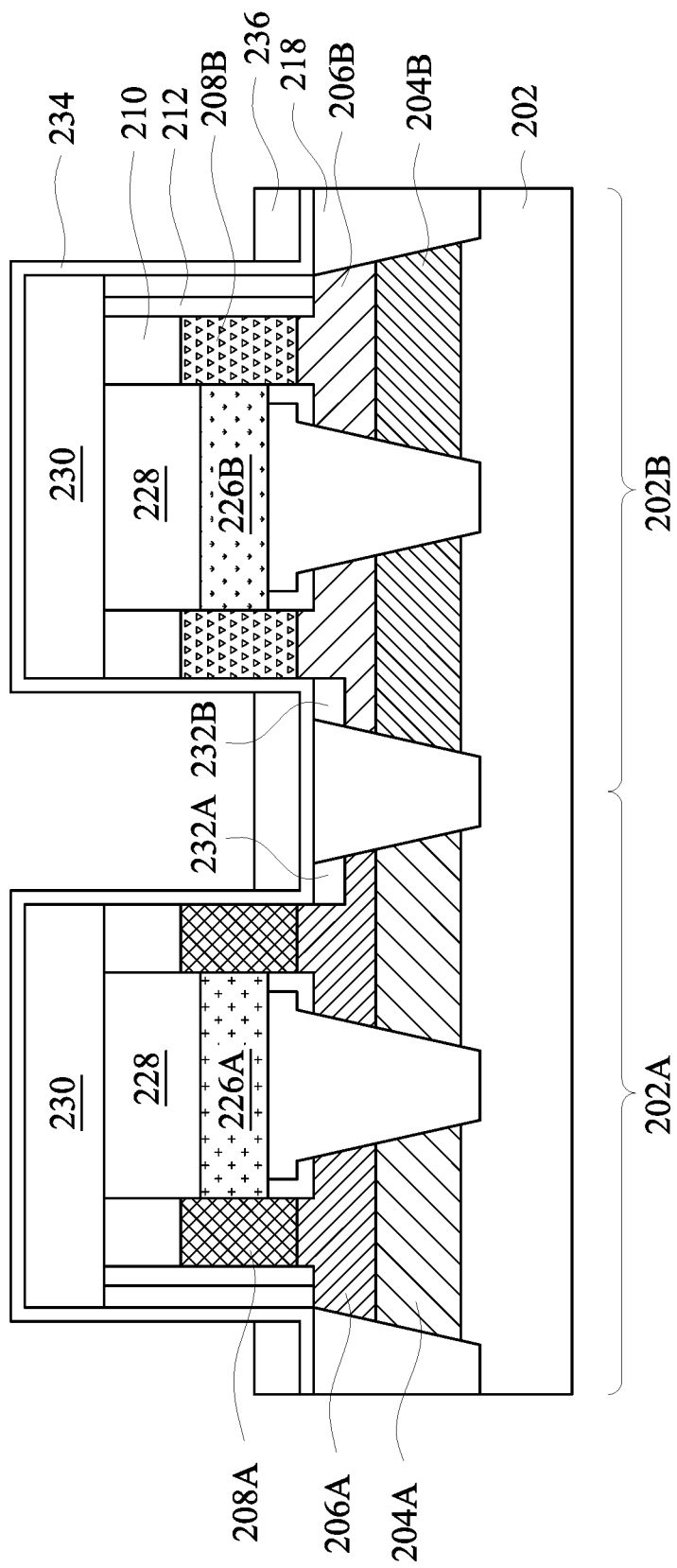

In FIG. 15, a portion of the dielectric layer 236 is removed by using one or more processes, such as a CMP process, an etching back process, combinations thereof, and/or the like. Particularly, a CMP process is first performed to planarize the dielectric layer 236, such that a top surface of the dielectric layer 236 is leveled with a top surface of the hard mask layer 234 above the hard mask layer 230, and an etching back process, such as a wet etching, a dry etching process and/or another suitable process, is then performed to reduce the height of the dielectric layer 236 to a desired height.

Figure 16:
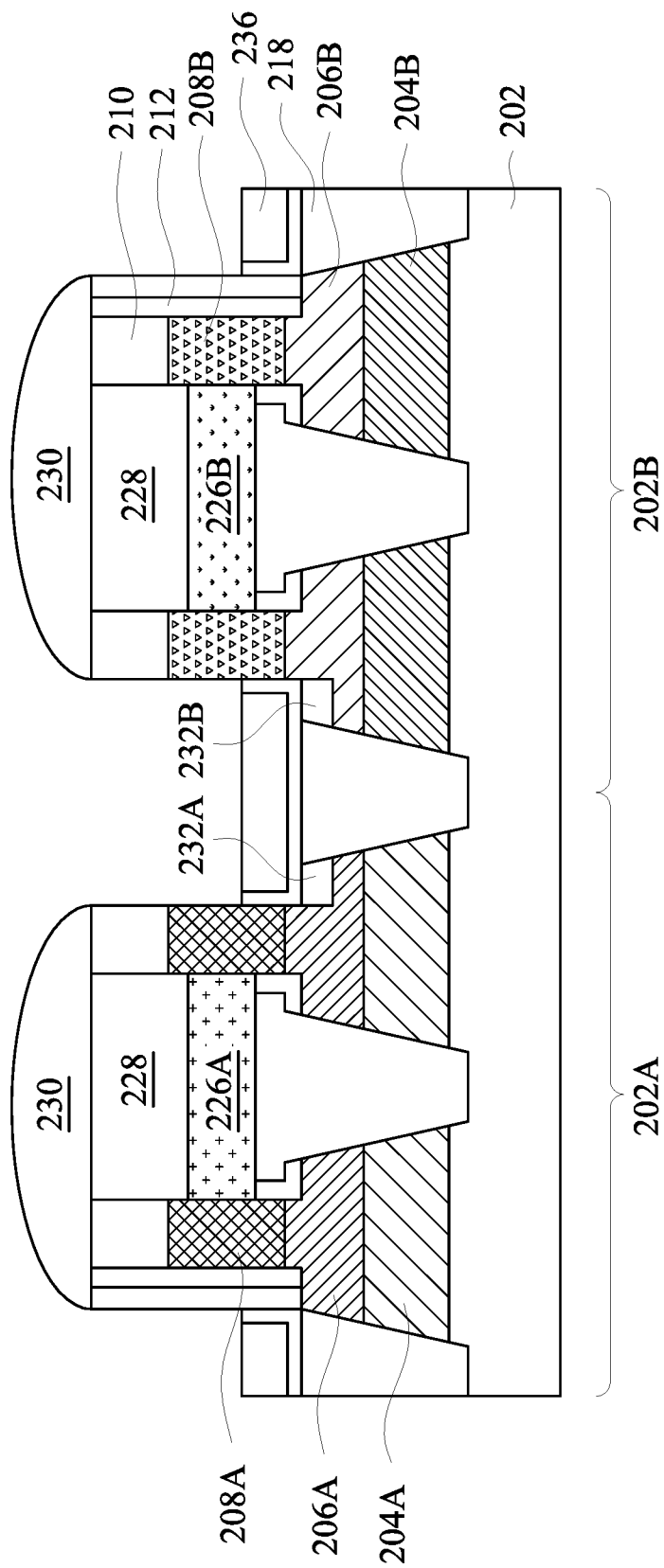

In FIG. 16, a portion of the hard mask layer 234 above a top surface of the remained dielectric layer 236, a portion of the hard mask layer 230 and a portion of the liner layer 212 are removed by using one or more etching process, such as a reactive ion etching process, a plasma etching process, a dry etching process, a wet etching process, combinations thereof, and/or another suitable etching process. After the etching process, as shown in FIG. 16, a portion of a sidewall of each of the vertical channel layers 208A and 208B is exposed.

Figure 17:
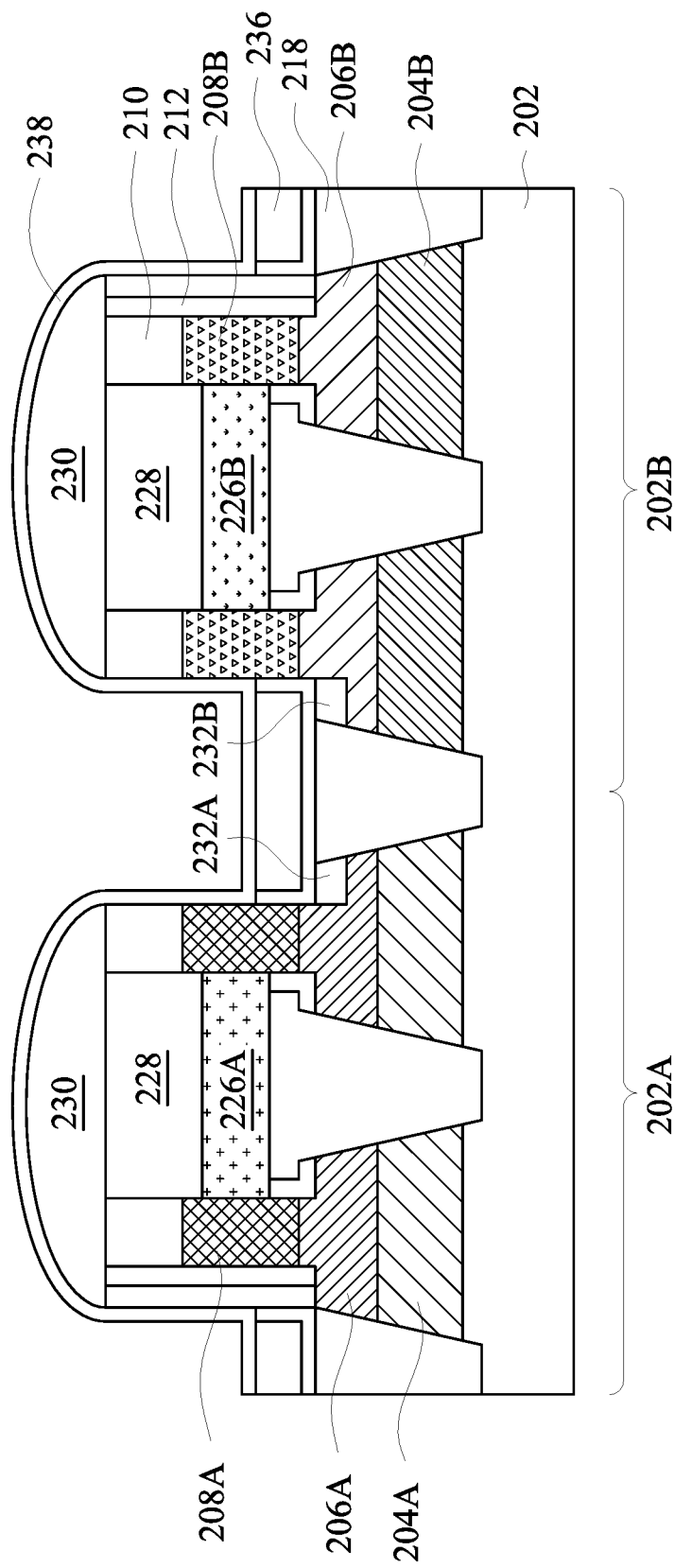

In FIG. 17, a gate stack 238 is formed over the vertical channel layers 208A and 208B, the hard mask layers 210, 230 and 234, and the dielectric layers 218 and 236. The gate stack 238 may include a gate dielectric layer and a gate electrode layer. The gate dielectric layer may be formed from a high-k material, such as nitride-based dielectric, silicon oxynitride, hafnium oxide, tantalum oxide, titanium oxide, zirconium oxide, aluminum oxide, yttrium oxide, lanthanum oxide, combinations thereof, and/or another suitable material, and may be formed by using an ALD process, a CVD process, a PVD process, a thermal oxidation process, a UV-ozone oxidation process, combinations thereof, or the like. Moreover, an interfacial layer of silicon oxide may be further formed between the high-k dielectric layer and the vertical channel layers 208A and 208B, in order to reduce damages between the gate dielectric layer and lateral contact surfaces of the vertical channel layers 208A and 208B. The gate electrode layer may be formed from polysilicon and a metallic material (such as titanium, tantalum, tungsten, aluminum, molybdenum, platinum and hafnium), a metal silicide material (such as titanium silicide, tantalum silicide, tungsten silicate, molybdenum silicate, nickel silicide and cobalt silicide), a metal nitride material (such as titanium nitride, tantalum nitride, tungsten nitride, molybdenum silicate, nickel nitride and cobalt nitride), silicide metal nitride (such as titanium silicon nitride, tantalum silicon nitride and tungsten silicon nitride), refractory metals, polysilicon, combinations thereof, and/or another suitable material, and may be formed by using, for example, a PVD process, a CVD process, an LPCVD process, an ALD process, a spin-on deposition process, a plating process, combinations thereof, or another suitable process.

Figure 18:
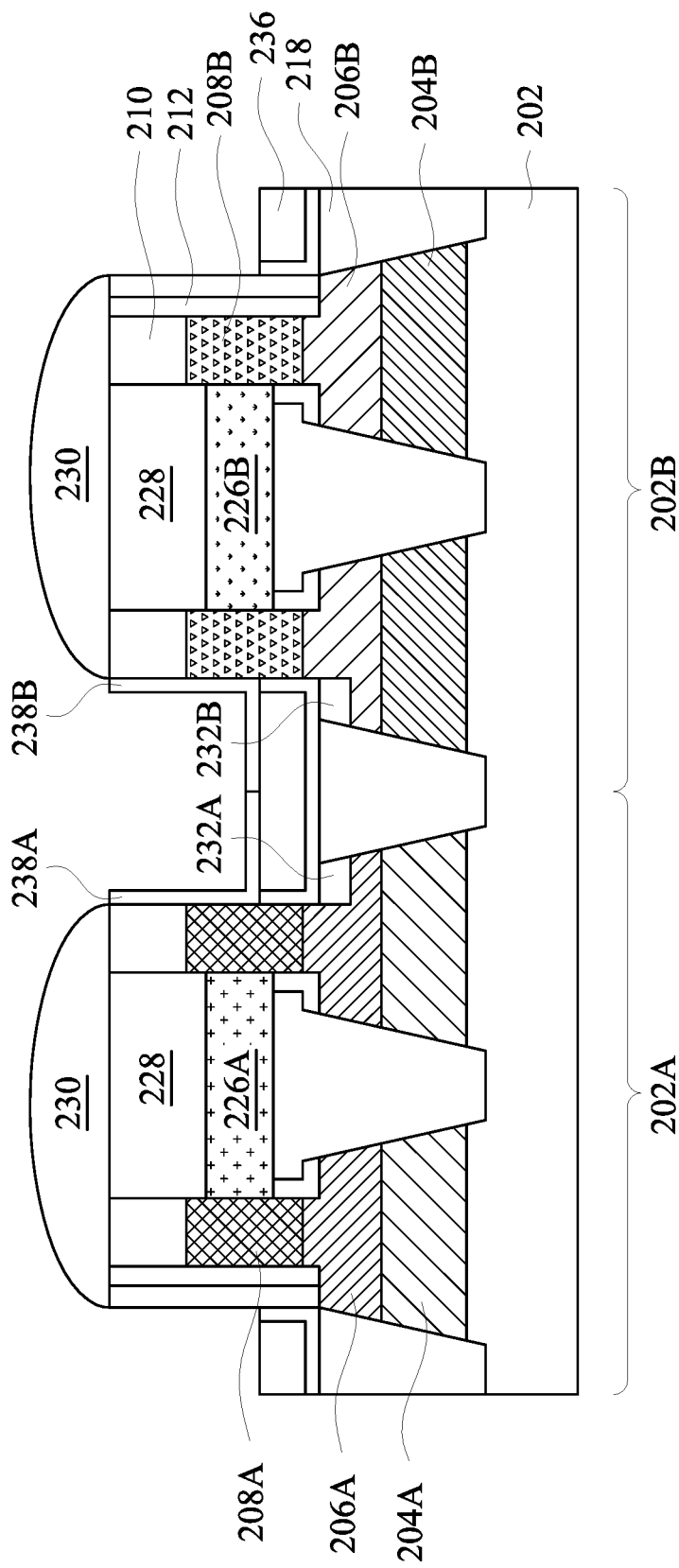

In FIG. 18, an unwanted portion of the gate stack 238 is removed by a patterning process including a photolithography process and an etching process, such as a reactive ion etching (RIE) process or another suitable process, and therefore gate structures 238A and 238B are respectively formed in the P-type device region 202A and in the N-type device region 202B. The gate structures 238A and 238B may be doped with metal dopants to have different work function values. In some embodiments, one or each of the gate structures 238A and 238B includes one or more work function layers.

Figure 19:
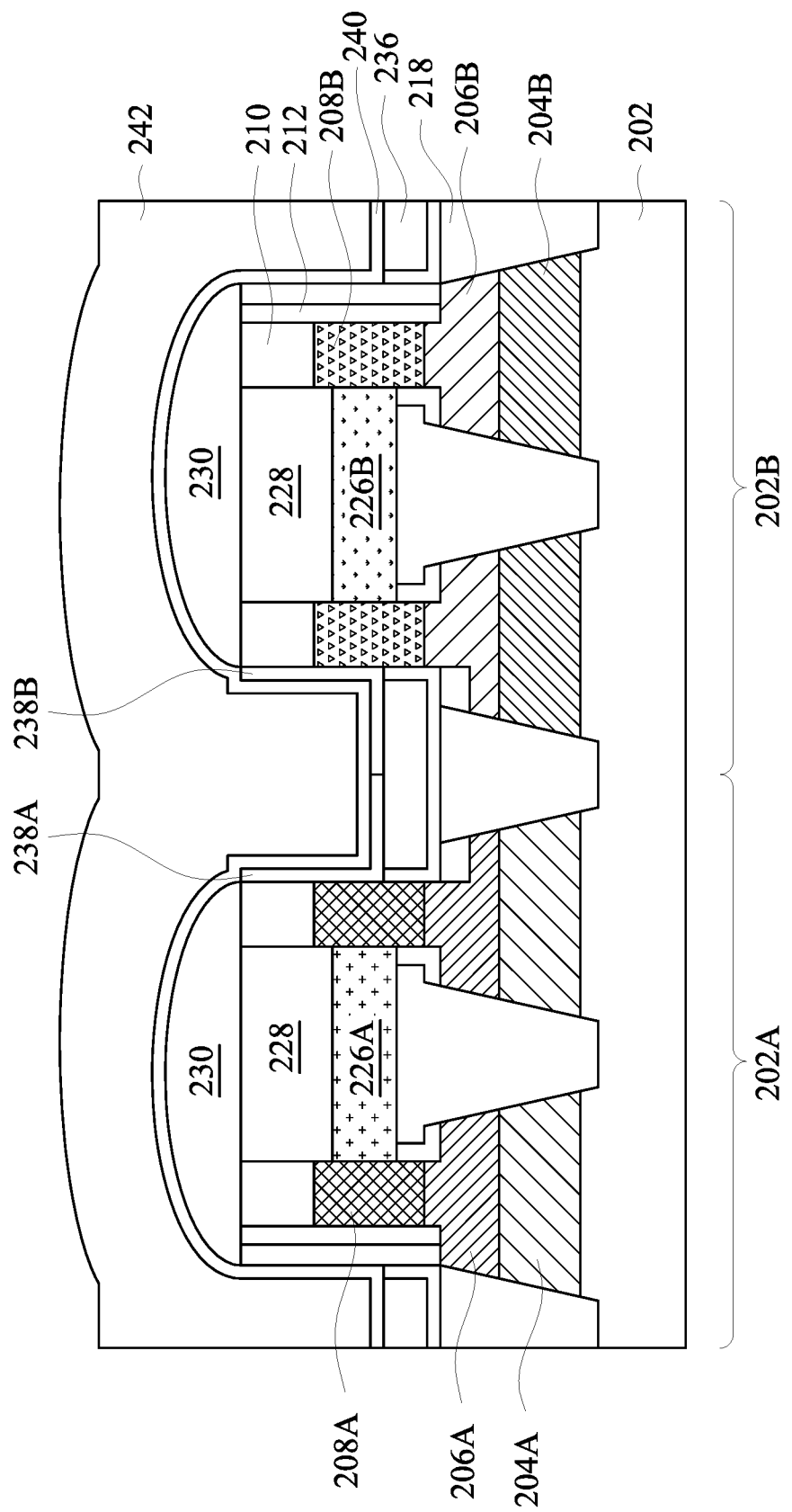

In FIG. 19, a hard mask layer 240 is formed over the dielectric layers 218 and 236, the hard mask layers 230 and 234, the silicide features 232A and 232B and the gate structures 238A and 238B, and a dielectric layer 242 is formed over the hard mask layer 240. The hard mask layer 234 may be formed from one or more dielectric materials, such as silicon oxide, silicon nitride, silicon oxynitride, silicon carbon nitride, silicon oxycarbonitride, titanium nitride, and/or the like, and may be formed by using one or more processes, such as a CVD process, an LPCVD process, a PECVD process, a PVD process, an ALD process, a spin-on coating process, a sputtering process, a thermal oxidation process, combinations thereof, and/or the like. The dielectric layer 242 may be formed from a flowable oxide by using a flowable CVD process or another suitable process.

Figure 20:
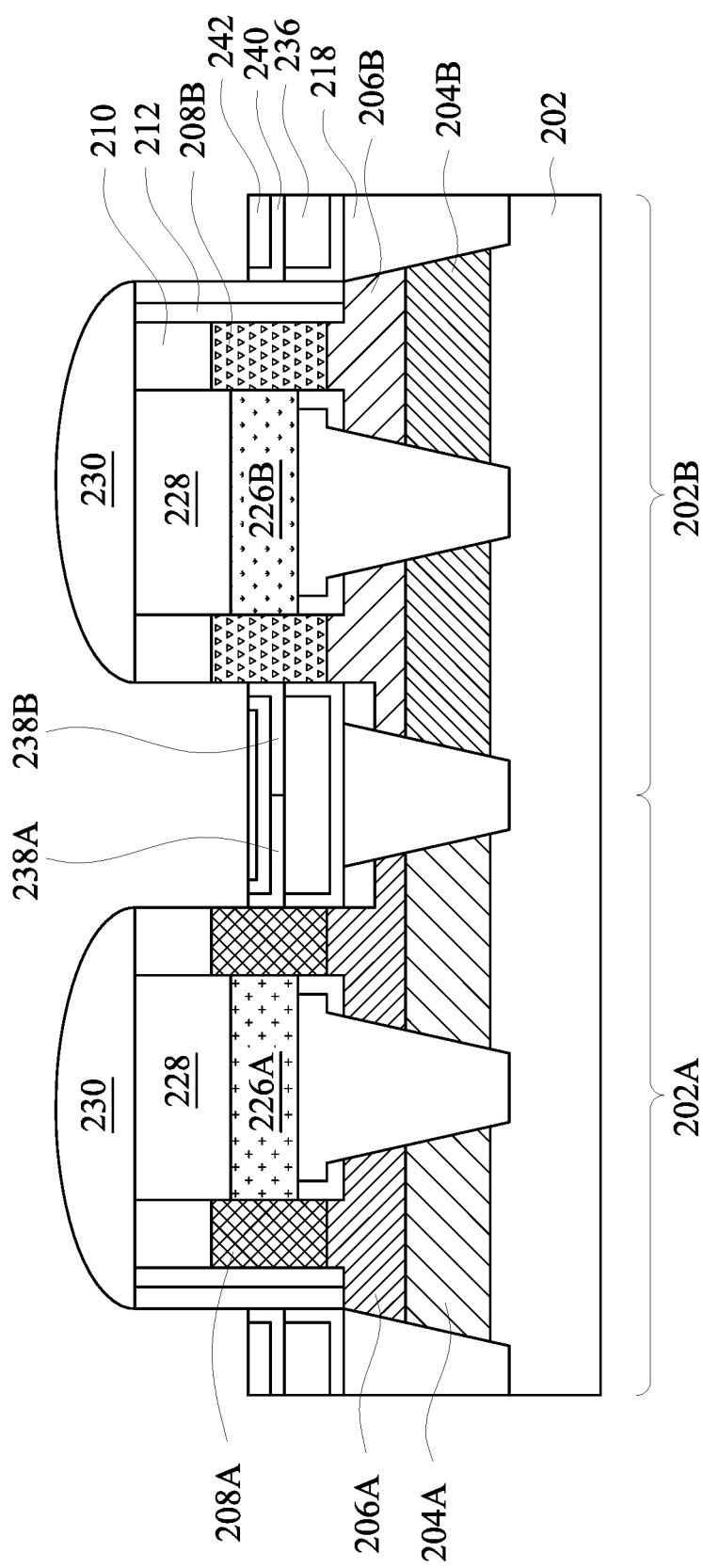

In FIG. 20, portions of the gate structures 238A and 238B, the hard mask layer 240 and the dielectric layer 242 above a height level of the semiconductor structure shown in FIG. 19 are removed by using one or more etching process, such as a reactive ion etching process, a plasma etching process, a dry etching process, a wet etching process, combinations thereof, and/or another suitable etching process, in order to determine vertical lengths of the gate structures 238A and 238B. A top end of the gate structure 238A may be lower than a top end of the vertical channel layer 208A, and a top end of the gate structure 238B may be lower than a top end of the vertical channel layer 208B. That is, portions of the vertical channel layers 208A and 208B are exposed after the etching process of FIG. 20. In certain embodiments, the gate structures 238A and 238B have different vertical lengths.

Figure 21:
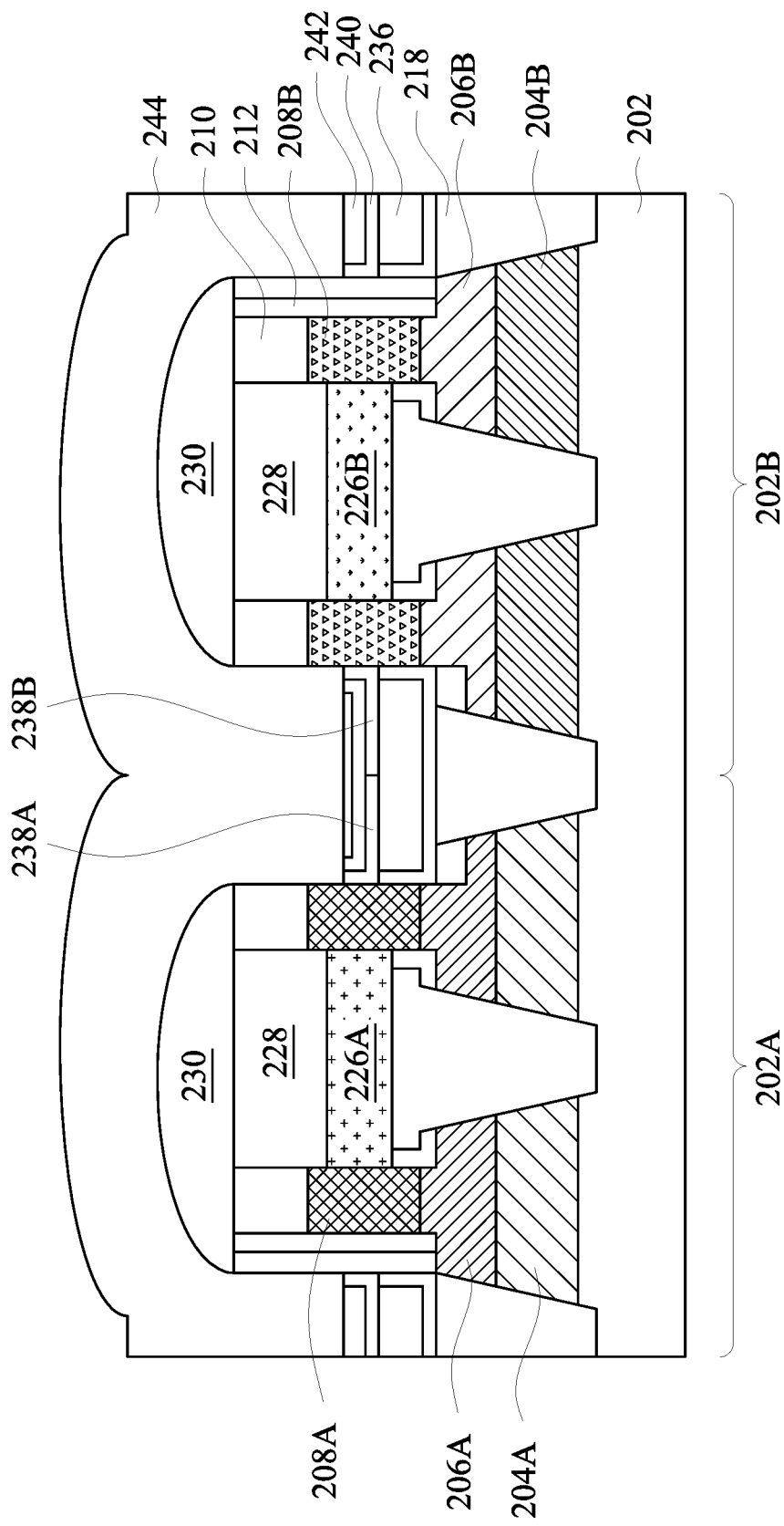

In FIG. 21, a dielectric layer 244 is formed over the vertical channel layers 208A and 208B, the hard mask layers 210, 230 and 240, the dielectric layers 218 and 242 and the gate structures 238A and 238B. The dielectric layer 244 may be formed from a flowable oxide by using a flowable CVD process or another suitable process.

Figure 22:
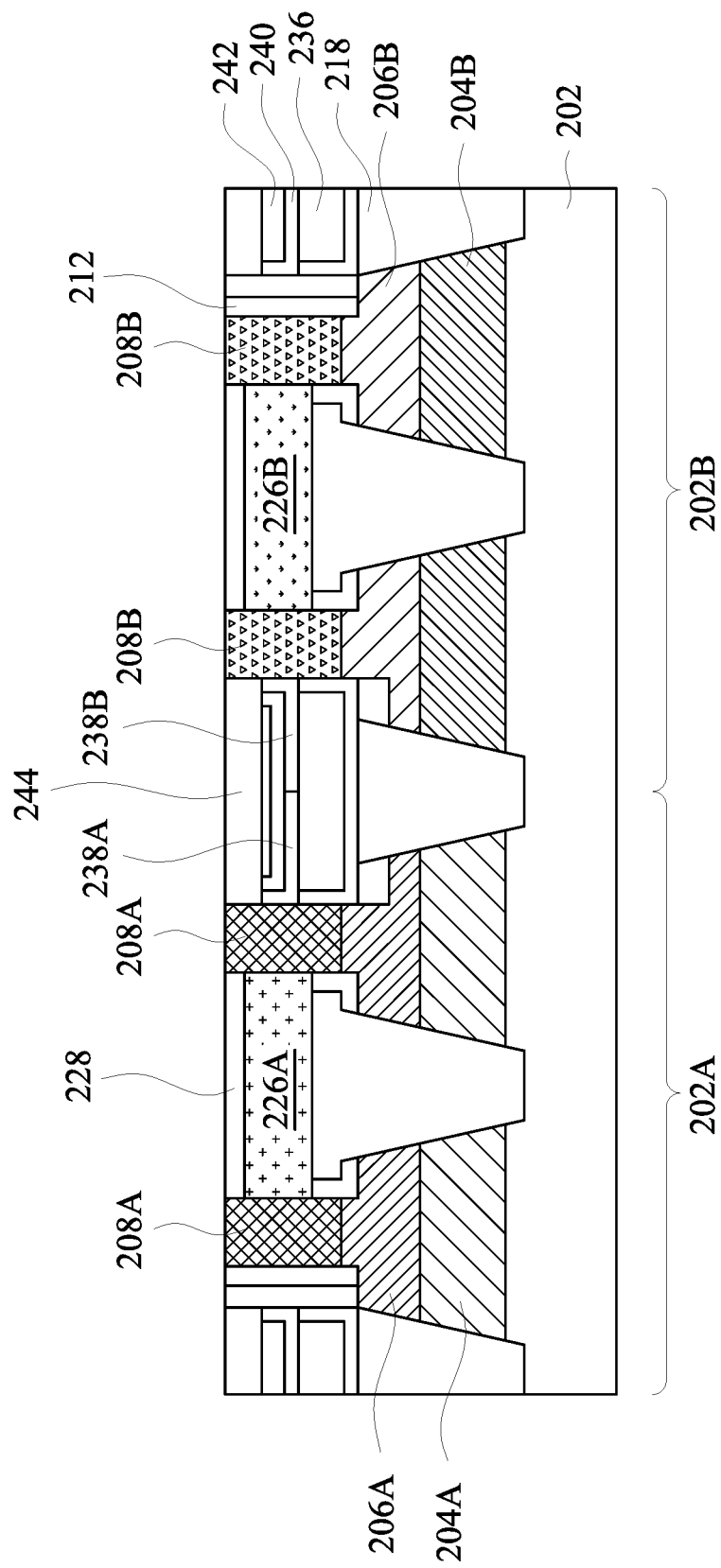

In FIG. 22, the hard mask layers 210 and 230, a portion of the liner layer 212 above the vertical channel layers 208A and 208B and a portion of the dielectric layer 244 above the vertical channel layers 208A and 208B are removed by using one or more processes, such as a CMP process, an etching back process, combinations thereof, and/or the like. As shown in FIG. 22, top ends of the vertical channel layers 208A and 208B are exposed after the removing process of FIG. 22.

Figure 23:
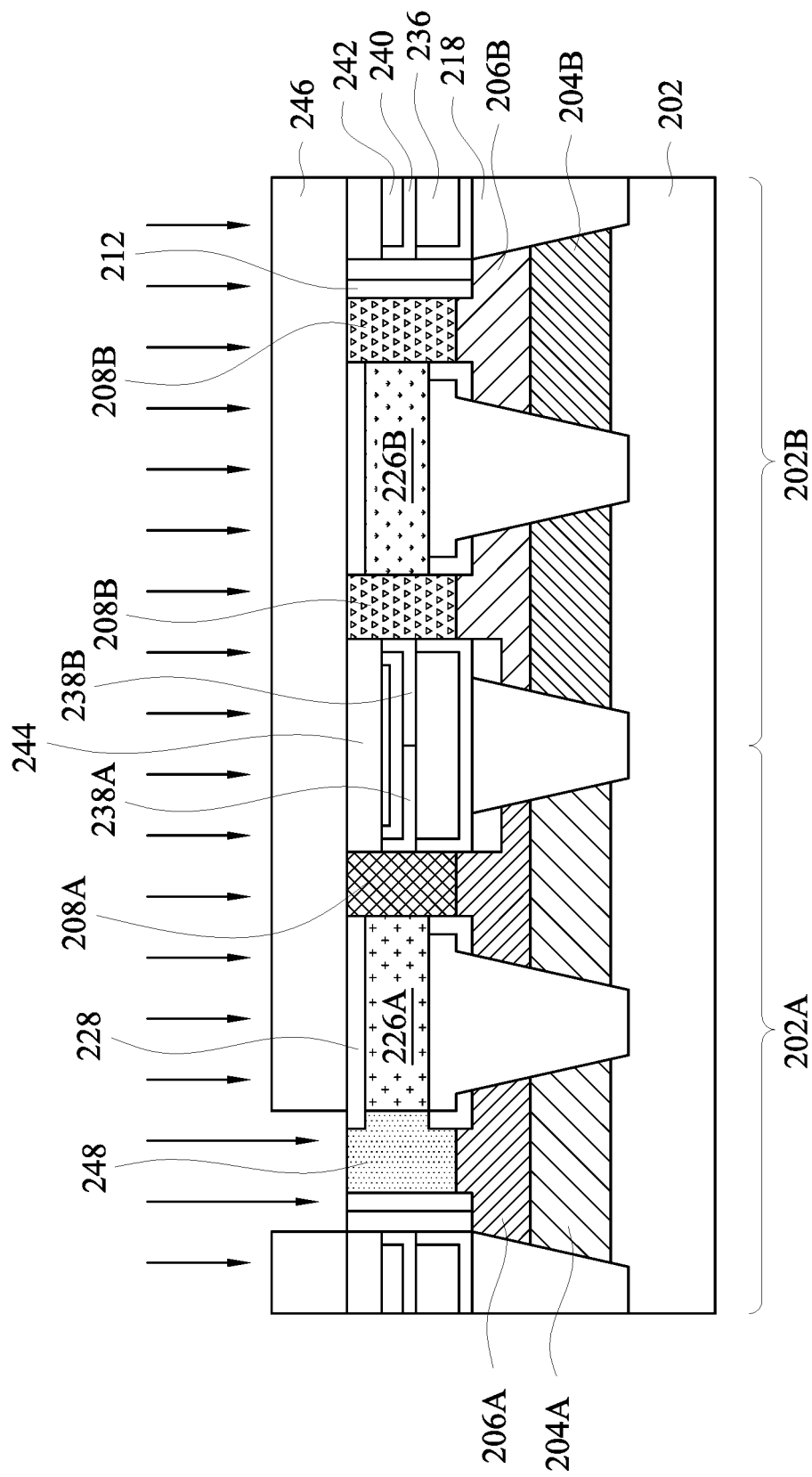

Optionally, in FIG. 23, a patterned photoresist 246 may be formed over the vertical channel layers 208A and 208B and the dielectric layer 244 to define a body implant portion of the vertical channel layer 208A and the body epitaxial layer 226A. Then, an implant process is performed on the body implant portion, so as to form a body terminal 248 in the P-type device region 202A. The body terminal 248 may be heavily doped with N-type dopants, such as phosphorus, arsenic, silicon, germanium, carbon, oxygen, sulfur, selenium, tellurium, antimony, combinations thereof, and the like. In some embodiments, a dopant concentration of the body terminal 248 may be about $10^{18}$ atoms/cm$^3$ to about $10^{22}$ atoms/cm$^3$, depending on various threshold voltage design requirements. The patterned photoresist 246 is stripped after the body terminal 248 is formed.

Figure 24:
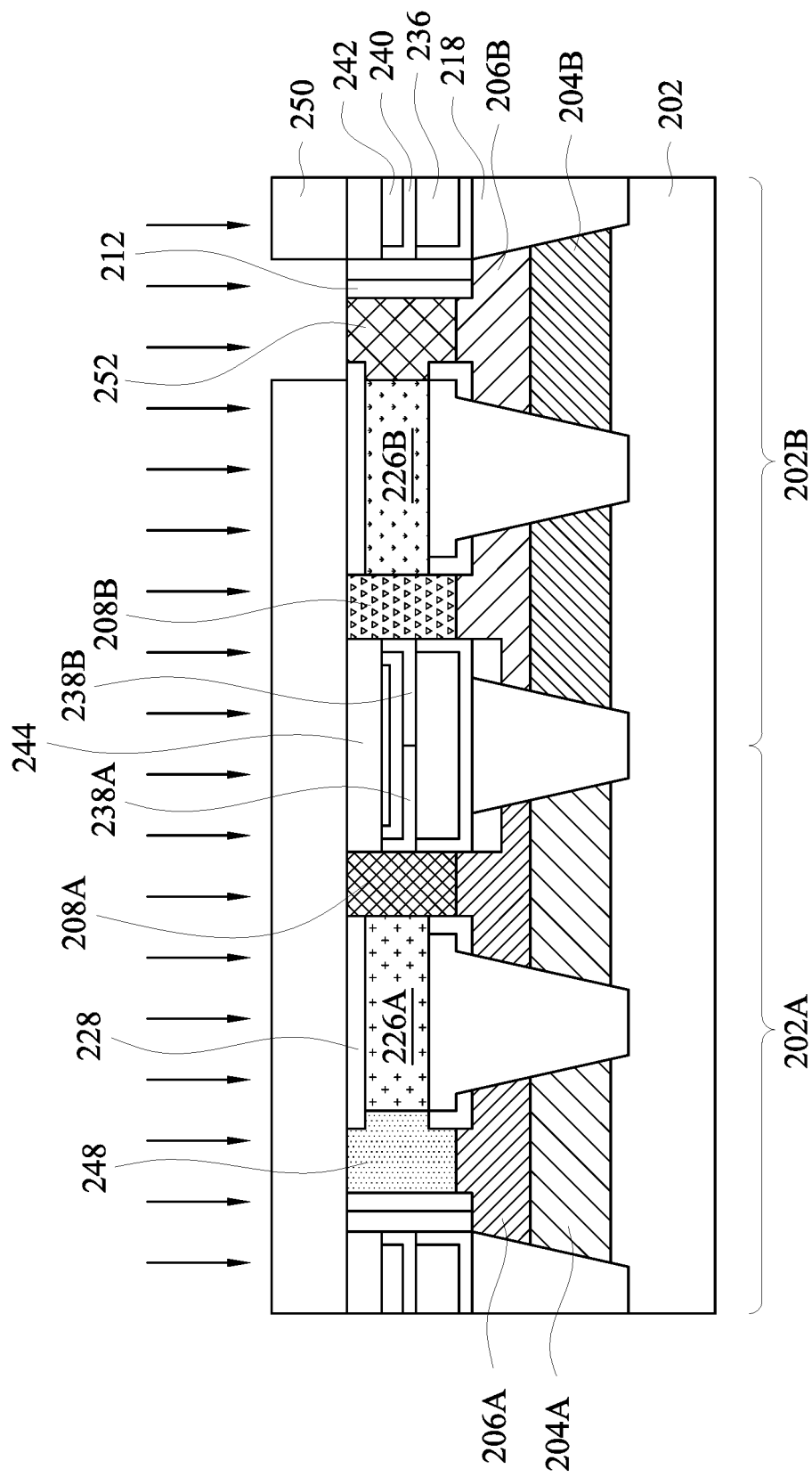

Further, in FIG. 24, a patterned photoresist 250 may be formed over the vertical channel layers 208A and 208B and the dielectric layer 244 to define a body implant portion of the vertical channel layer 208B and the body epitaxial layer 226B. Then, an implant process is performed on the body implant portion, so as to form a body terminal 225 in the N-type device region 202B. The body terminal 252 may be heavily doped with P-type dopants, such as phosphorus, arsenic, silicon, germanium, carbon, oxygen, sulfur, selenium, tellurium, antimony, combinations thereof, and the like. In some embodiments, a dopant concentration of the body terminal 252 may be about $10^{18}$ atoms/cm$^3$ to about $10^{22}$ atoms/cm$^3$, depending on various threshold voltage design requirements. The patterned photoresist 250 is stripped after the body terminal 252 is formed.

Figure 25:
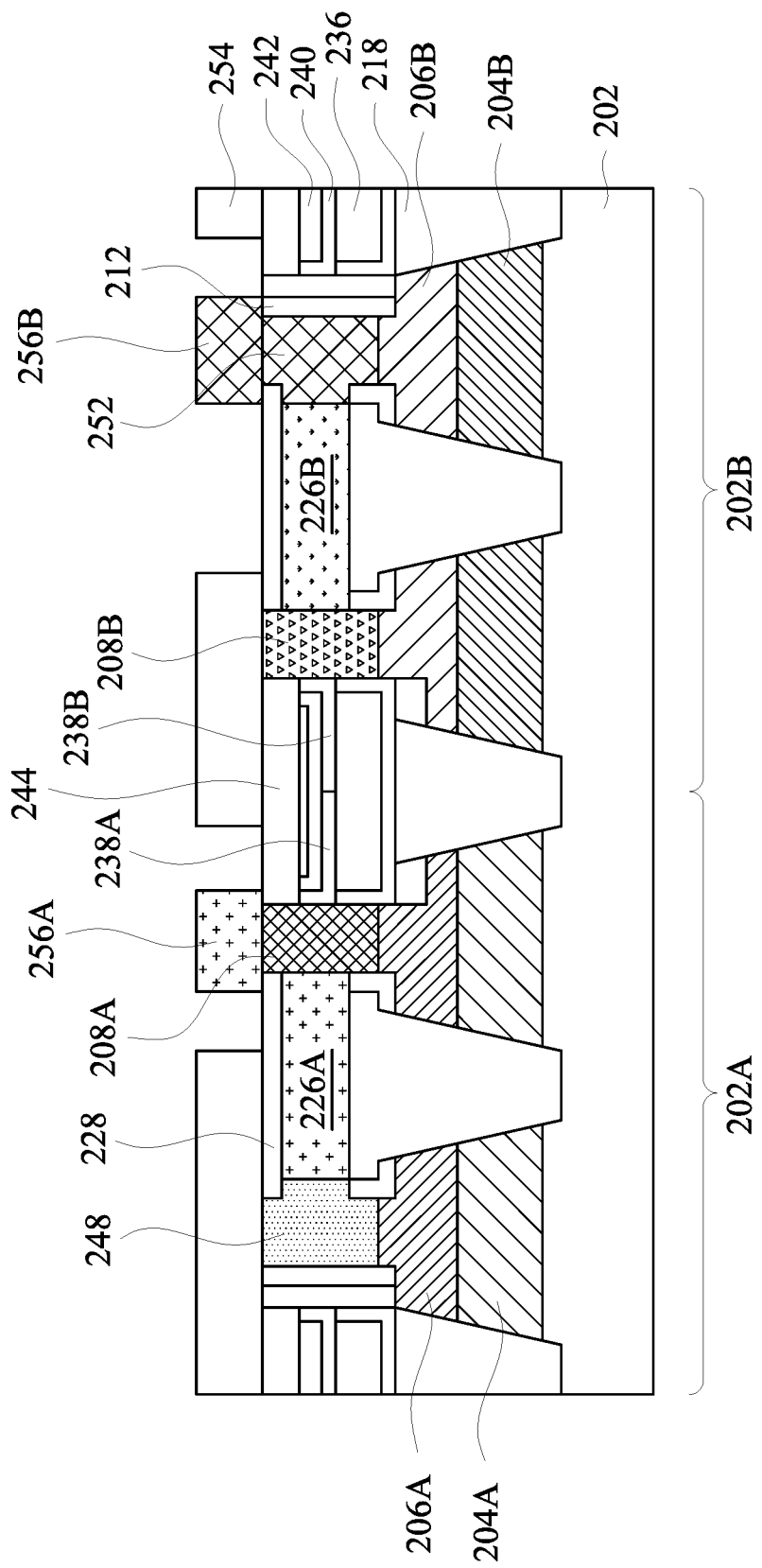

In FIG. 25, a patterned hard mask layer 254 is formed over the vertical channel layer 208B, the dielectric layers 218, 228 and 244 and the body terminal 248, and a dual epitaxial process is performed to form semiconductor structures 256A and 256B respectively on the vertical channel layer 208A and the body terminal 252. As shown in FIG. 25, the vertical channel layer 208A and the body terminal 252 are uncovered by the patterned hard mask layer 254. The patterned hard mask layer 254 may be formed from one or more dielectric materials, such as silicon oxide, silicon nitride, silicon oxynitride, silicon carbon nitride, silicon oxycarbonitride, titanium nitride, and/or the like. The semiconductor structures 256A and 256B may be formed by epitaxially growing a semiconductor material, such as silicon, germanium, silicon germanium, silicon carbide, silicon phosphoric, silicon phosphoric carbide, a III-V material such as indium phosphoric, gallium arsenide, aluminum arsenide, indium arsenide, aluminum indium arsenide, gallium indium arsenide, indium antimonide, gallium antimonide and indium gallium antimonide, combinations thereof, or the like. In addition, the semiconductor structure 256A may be doped or heavily doped with P-type dopants, such as boron, boron fluoride, silicon, germanium, carbon, zinc, cadmium, beryllium, magnesium, indium, combinations thereof, and/or the like, while the semiconductor structure 256B may be doped or heavily doped with N-type dopants, such as phosphorus, arsenic, silicon, germanium, carbon, oxygen, sulfur, selenium, tellurium, antimony, combinations thereof, and/or the like. The patterned hard mask layer 254 is removed after the semiconductor structures 256A and 256B are formed.

Figure 26:
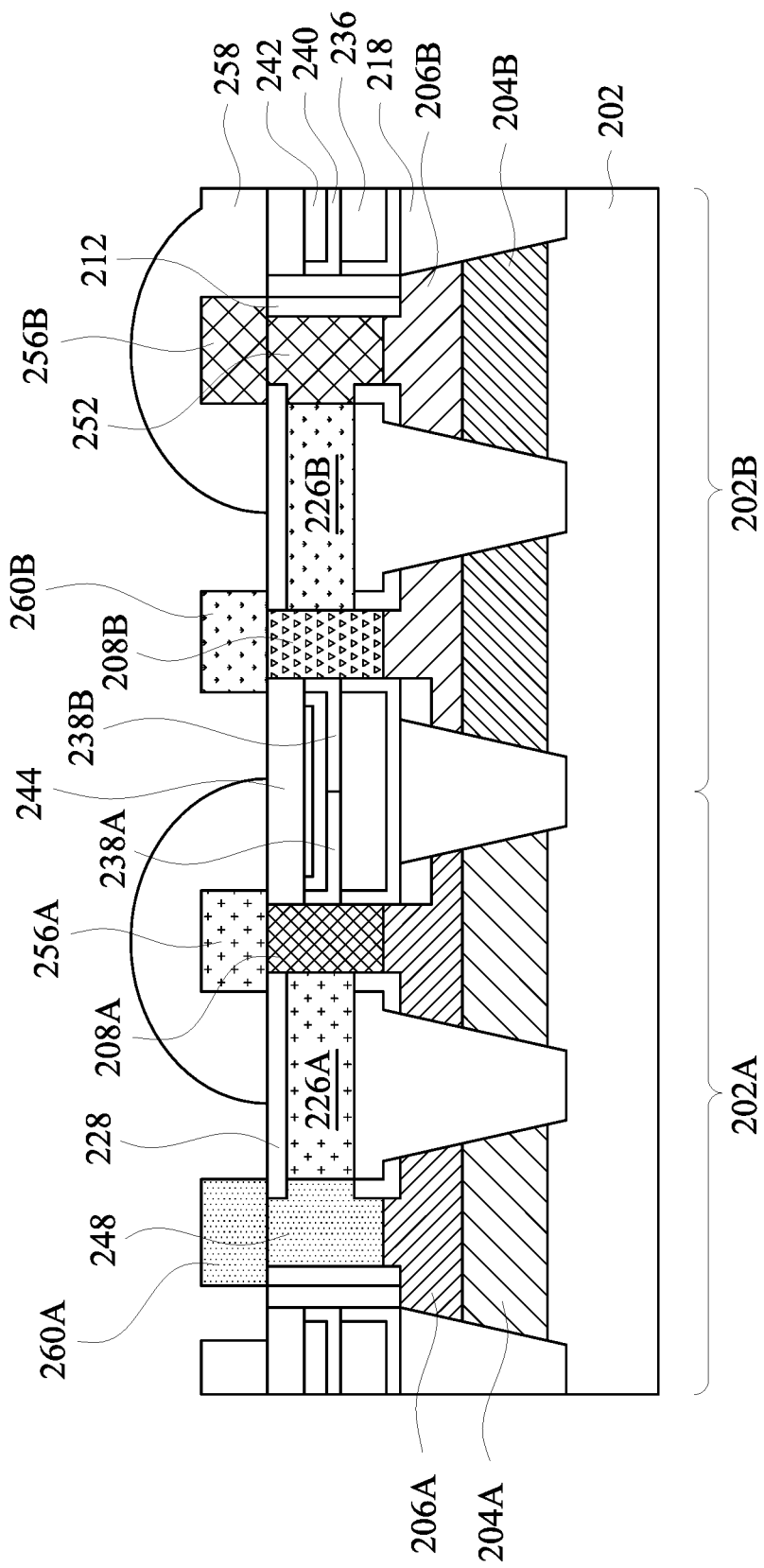

In FIG. 26, a patterned hard mask layer 258 is formed over the vertical channel layer 208A, the dielectric layers 218, 228 and 244, the body terminal 252 and the semiconductor structures 256A and 256B, and a dual epitaxial process is performed to form semiconductor structures 260A and 260B respectively on the vertical channel layer 208B and the body terminal 248. As shown in FIG. 26, the vertical channel layer 208B and the body terminal 252 are uncovered by the patterned hard mask layer 258. The patterned hard mask layer 258 may be formed from one or more dielectric materials, such as silicon oxide, silicon nitride, silicon oxynitride, silicon carbon nitride, silicon oxycarbonitride, titanium nitride, and/or the like. The semiconductor structures 260A and 260B may be formed by epitaxially growing a semiconductor material, such as silicon, germanium, silicon germanium, silicon carbide, silicon phosphoric, silicon phosphoric carbide, a III-V material such as indium phosphoric, gallium arsenide, aluminum arsenide, indium arsenide, aluminum indium arsenide, gallium indium arsenide, indium antimonide, gallium antimonide and indium gallium antimonide, combinations thereof, or the like. In addition, the semiconductor structure 260A may be doped or heavily doped with P-type dopants, such as boron, boron fluoride, silicon, germanium, carbon, zinc, cadmium, beryllium, magnesium, indium, combinations thereof, and/ or the like, while the semiconductor structure 260B may be doped or heavily doped with N-type dopants, such as phosphorus, arsenic, silicon, germanium, carbon, oxygen, sulfur, selenium, tellurium, antimony, combinations thereof, and/or the like. The patterned hard mask layer 258 is removed after the semiconductor structures 260A and 260B are formed.

Figure 27:
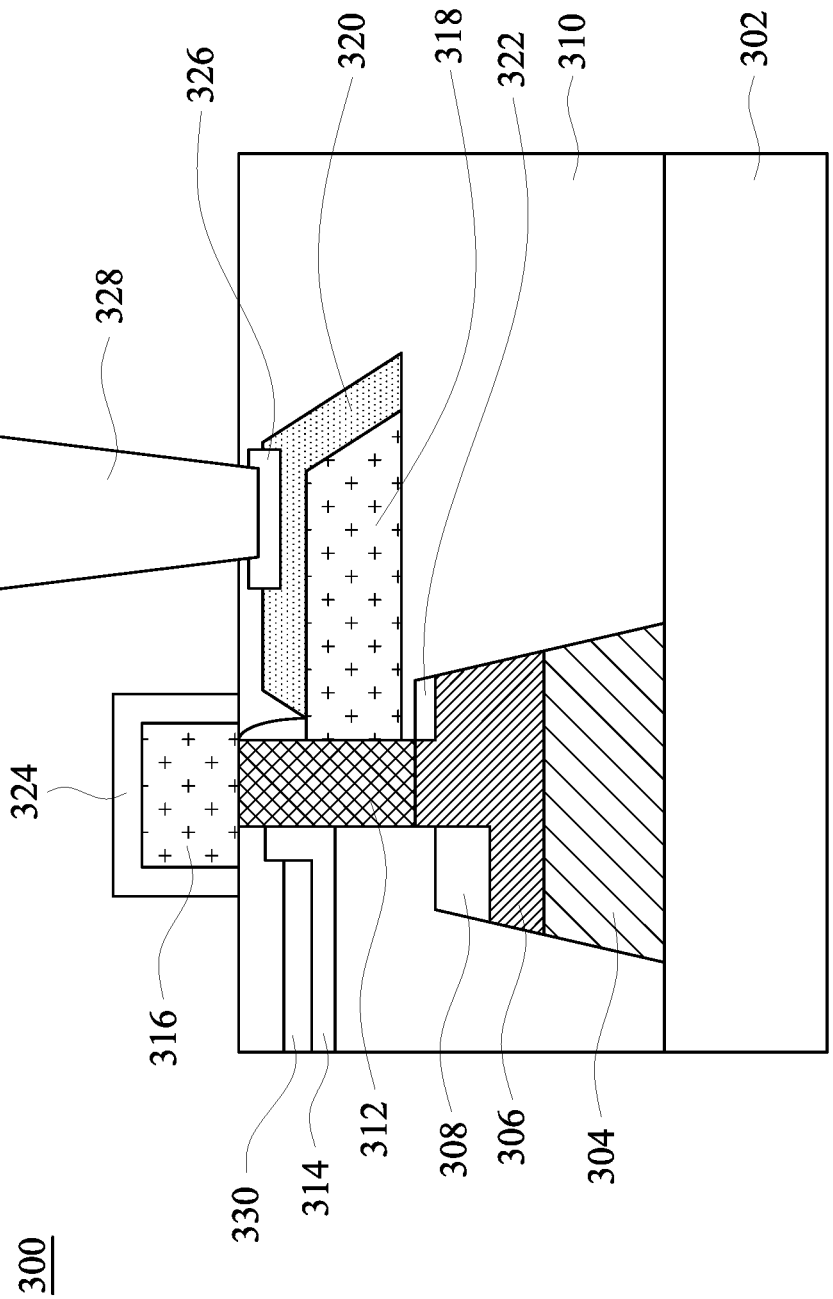
FIG. 27 is a schematic cross-sectional view of a semiconductor device in accordance with some embodiments of the present disclosure.

FIG. 27 is a schematic cross-sectional diagram of a semiconductor device 300 in accordance with some embodiments of the present disclosure. As shown in FIG. 27, the left part of the semiconductor device 300 (including a substrate 302, a well 304, a first source/drain structure 306, a dielectric layer 308, a silicide feature 310, a vertical channel layer 312, a gate structure 314, a second source/drain structure 316, a liner layer 322 and a silicide feature 324) is similarly to the left part of the semiconductor device 100 (including the substrate 102, the well 104A, the first source/drain structure 106A, the dielectric layer 108, the silicide feature 110, the vertical channel layer 112, the gate structure 114, the second source/drain structure 116, the liner layer 124 and the silicide feature 126) shown in FIG. 1A, and the details are not repeated herein.

In particular, the semiconductor device 300 includes a body structure different from the body structure of the semiconductor device 100. The body structure of the semiconductor device 300 is in contact with the vertical channel layer 312 and opposite to the gate structure 314. The body structure includes a body epitaxial layer 318 and a body terminal 320 stacked on the body epitaxial layer 318, and may be formed by one or more epitaxial growth processes. The body epitaxial layer 318 borders the other portion of the sidewalls of the vertical channel layer 312 that is not surrounded by the gate structure 314. In the embodiments where the semiconductor device 300 is a P-type FET, the body epitaxial layer 318 may include essential germanium or silicon germanium and may be implanted with P-type dopants, such as boron, boron fluorine, aluminum, gallium, indium, combinations thereof, and/or the like. Oppositely, in the embodiments where the semiconductor device 300 is an N-type FET, the body epitaxial layer 318 may include essential silicon and may be implanted with N-type dopants, such as phosphorus, arsenic, antimony, combinations thereof, and/or the like. The body epitaxial layer 318 may have a trapezoidal shape, a rectangular shape or another similar shape in its cross-sectional view. A dopant concentration of the body epitaxial layer 318 may be about $10^{18}$ atoms/cm$^3$ to about $10^{22}$ atoms/cm$^3$, depending on various threshold voltage design requirements.

The body terminal 320 is above and in contact with the body epitaxial layer 318. In the embodiments where the semiconductor device 300 is a P-type FET, the body terminal 320 may include essential silicon and may be implanted with N-type dopants, such as phosphorus, arsenic, antimony, combinations thereof, and/or the like. Oppositely, in the embodiments where the semiconductor device 300 is an N-type FET, the body terminal 320 may include essential germanium or silicon germanium and may be implanted with P-type dopants, such as boron, boron fluorine, aluminum, gallium, indium, combinations thereof, and/or the like. In some embodiments, a dopant concentration of the body terminal 320 may be about $10^{18}$ atoms/cm$^3$ to about $10^{22}$ atoms/cm$^3$, depending on various threshold voltage design requirements.

A silicide feature 326 is above and in contact with the body terminal 320 for electrically connection with another device. The silicide feature 324 may include a conductive material, for example, titanium, nickel, platinum, cobalt, combinations thereof, or the like.

An interconnect feature 328 are above and in contact with the silicide feature 326, for electrically coupling the body structure with external devices. The interconnect feature 328 may include one or more layers of metal lines and/or vias. The interconnect feature 328 may include a conductive material such as copper, aluminum, nickel, titanium, tungsten, combinations thereof, and/or another suitable conductive material. Although not shown in FIG. 27, it is known that other interconnect features may be above and in contact with the silicide features 310 and 324 for electrically coupling the first source/drain structure 306 and the second source/drain structure 316 with external devices.

Furthermore, the semiconductor device 300 may further include one or more hard mask layers 330 in its structure. The hard mask layers 330 may include one or more dielectric materials, such as silicon oxide, silicon nitride, silicon oxynitride, silicon carbon nitride, silicon oxycarbonitride, titanium nitride, and/or the like.

In accordance with some embodiments, a semiconductor device includes a first source/drain structure, a channel layer, a second source/drain structure, a gate structure and an epitaxial layer. The channel layer is above the first source/drain structure. The second source/drain structure is above the channel layer. The gate structure is on opposite first and second sidewalls of the channel layer when viewed in a first cross-section taken along a first direction. The gate structure is also on a third sidewall of the channel layer but absent from a fourth sidewall of the channel layer when viewed in a second cross-section taken along a second direction different from the first direction. The epitaxial layer is on the fourth sidewall of the channel layer when viewed in the second cross-section and forming a P-N junction with the channel layer.

In accordance with some embodiments, a semiconductor device includes first and second source/drain structure, a channel layer, an epitaxial layer, and a doped semiconductor structure. The first and second source/drain structures are of a first conductivity type. The channel layer extends upward from the first source/drain structure to the second source/drain structure. The channel layer is of a second conductivity type opposite the first conductivity type. The epitaxial layer extends laterally from a sidewall of the channel layer. The epitaxial layer is of the first conductivity type. The doped semiconductor structure is of the second conductivity type and forming a P-N junction with the epitaxial layer. The doped semiconductor structure has a higher dopant concentration of the second conductivity type than the channel layer.

In accordance with some embodiments, a semiconductor device includes a first source/drain structure, a channel layer, a second source/drain structure, a first epitaxial layer and a second epitaxial layer. The channel layer is disposed over the first source/drain structure. The second source/drain structure is disposed over the channel layer. The first epitaxial layer forms a first P-N junction with a sidewall of the channel layer. The second epitaxial layer forms a second P-N junction with a top surface of the first epitaxial layer and a sidewall of the first epitaxial layer extending at an obtuse angle from the top surface of the first epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first source/drain structure;
a channel layer above the first source/drain structure;
a second source/drain structure above the channel layer;
a gate structure on a first side surface of the channel layer;
an epitaxial layer forming a P-N junction with a second side surface of the channel layer; and
a body terminal forming a P-N junction with the epitaxial layer.

2. The semiconductor device of claim 1, wherein the channel layer has a top surface higher than a top surface of the epitaxial layer, and a bottom surface lower than a bottom surface of the epitaxial layer.

3. The semiconductor device of claim 1, wherein the body terminal has a dopant concentration greater than a dopant concentration of the channel layer.

4. The semiconductor device of claim 1, wherein the body terminal and the channel layer are of p-type, and the epitaxial layer is of n-type.

5. The semiconductor device of claim 1, wherein the body terminal and the channel layer are of n-type, and the epitaxial layer is of p-type.

6. The semiconductor device of claim 1, wherein the second source/drain structure has a different cross-sectional shape than the first source/drain structure.

7. The semiconductor device of claim 1, wherein the second source/drain structure has a width less than a maximal width of the first source/drain structure.

8. The semiconductor device of claim 1, wherein the gate structure has a top surface higher than a top surface of the epitaxial layer.

9. A semiconductor device, comprising:
source/drain structures of a first conductivity type;
a first semiconductor pillar extending between the source/drain structures, the first semiconductor pillar being of a second conductivity type opposite the first conductivity type, and forming a field effect transistor (FET) with the source/drain structures;
a semiconductor layer interfacing the first semiconductor pillar, the semiconductor layer being of the first conductivity type; and
a second semiconductor pillar of the second conductivity type interfacing the semiconductor layer, the first and second semiconductor pillar forming a bipolar junction transistor (BJT) with the semiconductor layer.

10. The semiconductor device of claim 9, wherein the semiconductor layer has a top surface lower than a top surface of the first semiconductor pillar, and a bottom surface higher than a bottom surface of the first semiconductor pillar.

11. The semiconductor device of claim 9, wherein the semiconductor layer has a top surface lower than a top surface of the second semiconductor pillar, and a bottom surface higher than a bottom surface of the second semiconductor pillar.

12. The semiconductor device of claim 9, wherein the second semiconductor pillar has an n-type dopant concentration greater than an n-type dopant concentration of the first semiconductor pillar.

13. The semiconductor device of claim 9, wherein the second semiconductor pillar has a p-type dopant concentration greater than a p-type dopant concentration of the first semiconductor pillar.

14. The semiconductor device of claim 9, further comprising:
a first silicide feature on a lower one of the source/drain structures; and
a second silicide feature on an upper one of the source/drain structures.

15. The semiconductor device of claim 14, wherein the first silicide feature has a different cross-sectional shape than the second silicide feature.

16. A semiconductor device, comprising:
source/drain structures at different heights above a substrate;
a semiconductor pillar connecting the source/drain structures, and forming a field effect transistor (FET) with the source/drain structures;
a first semiconductor layer forming a first P-N junction with the semiconductor pillar; and
a second semiconductor layer covering the first semiconductor layer and forming a second P-N junction with the first semiconductor layer.

17. The semiconductor device of claim 16, wherein the first, second semiconductor layers and the semiconductor pillar form a bipolar junction transistor (BJT).

18. The semiconductor device of claim 16, wherein the first semiconductor layer has a trapezoidal cross-section.

19. The semiconductor device of claim 18, wherein the second semiconductor layer interfaces an upper base and a leg of the trapezoidal cross-section of the first semiconductor layer.

20. The semiconductor device of claim 16, further comprising:
a silicide region on the second semiconductor layer; and
a metal plug on the silicide region.

* * * * *